(12) United States Patent
Oikawa et al.

(10) Patent No.: US 10,027,311 B1
(45) Date of Patent: Jul. 17, 2018

(54) SEMICONDUCTOR DEVICE

(71) Applicant: Renesas Electronics Corporation, Tokyo (JP)

(72) Inventors: Ryuichi Oikawa, Tokyo (JP); Wataru Shiroi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/812,831

(22) Filed: Nov. 14, 2017

(30) Foreign Application Priority Data

Dec. 27, 2016 (JP) ................................. 2016-254120

(51) Int. Cl.
| | |
|---|---|
| *H03K 17/16* | (2006.01) |
| *H03K 19/003* | (2006.01) |
| *H03H 11/28* | (2006.01) |
| *H01L 25/18* | (2006.01) |
| *H01L 23/498* | (2006.01) |
| *H01L 23/50* | (2006.01) |
| *H01L 23/538* | (2006.01) |
| *H01L 23/64* | (2006.01) |

(52) U.S. Cl.
CPC ....... *H03H 11/28* (2013.01); *H01L 23/49816* (2013.01); *H01L 23/49827* (2013.01); *H01L 23/49833* (2013.01); *H01L 23/49894* (2013.01); *H01L 23/50* (2013.01); *H01L 23/5386* (2013.01); *H01L 23/647* (2013.01); *H01L 25/18* (2013.01)

(58) Field of Classification Search
CPC .............. H03H 11/28; H01L 23/49816; H01L 23/49827; H01L 23/49833; H01L 23/49894; H01L 23/50; H01L 23/5386; H01L 23/647; H01L 25/18
USPC .......................................................... 326/30
See application file for complete search history.

(56) References Cited

U.S. PATENT DOCUMENTS

| | | | | |
|---|---|---|---|---|
| 6,515,501 | B2* | 2/2003 | Bosnyak | ................ H05K 1/025 |
| | | | | 326/26 |
| 2010/0327922 | A1* | 12/2010 | Ando | .................. G11C 7/1051 |
| | | | | 327/141 |

FOREIGN PATENT DOCUMENTS

JP       2001-111408 A     4/2001

* cited by examiner

*Primary Examiner* — Daniel D Chang
(74) *Attorney, Agent, or Firm* — McGinn IP Law Group, PLLC

(57) ABSTRACT

To provide an inexpensive semiconductor device capable of suppressing the influence by crosstalk. A semiconductor device includes a signal wiring disposed in an organic interposer, an output circuit which is coupled to a first end of the signal wiring and which sets an impedance so as to generate a reflected wave antiphase to a waveform transmitted to the first end and periodically outputs data, and an input circuit which is coupled to a second end of the signal wiring and sets an impedance so as to generate a reflected wave of the same phase as a waveform transmitted to the second end. An average delay of the signal wiring is set to be 1/integer of 2 or more relative to a half of a cycle of the data. A difference between the maximum and minimum values of a delay of a signal at each of other signal wirings disposed in the organic interposer is set to be not greater than the average delay.

13 Claims, 16 Drawing Sheets

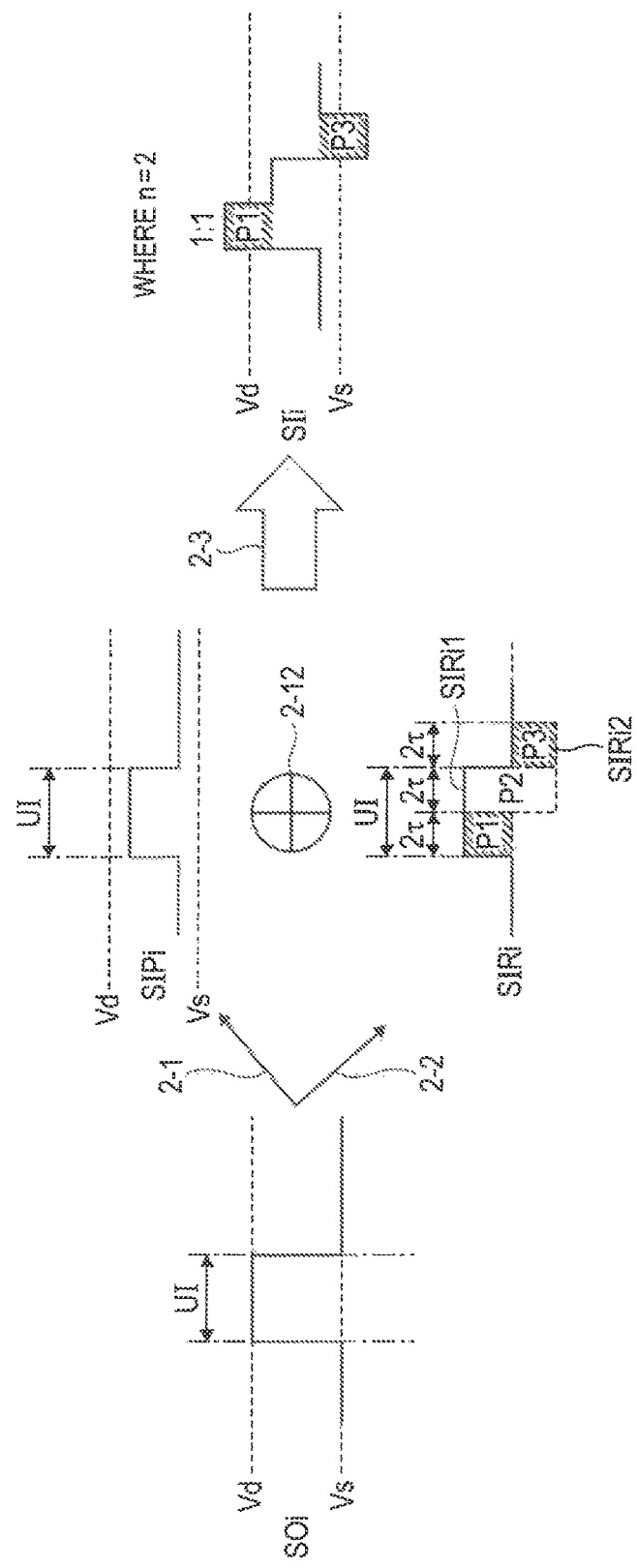

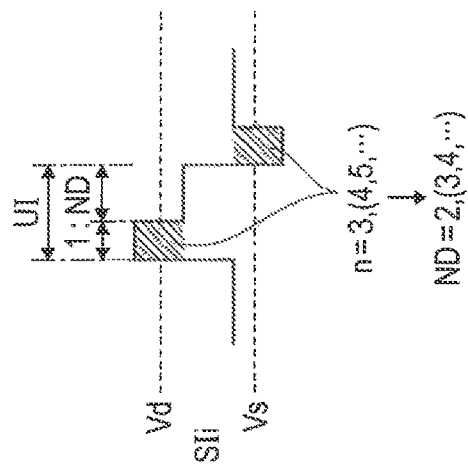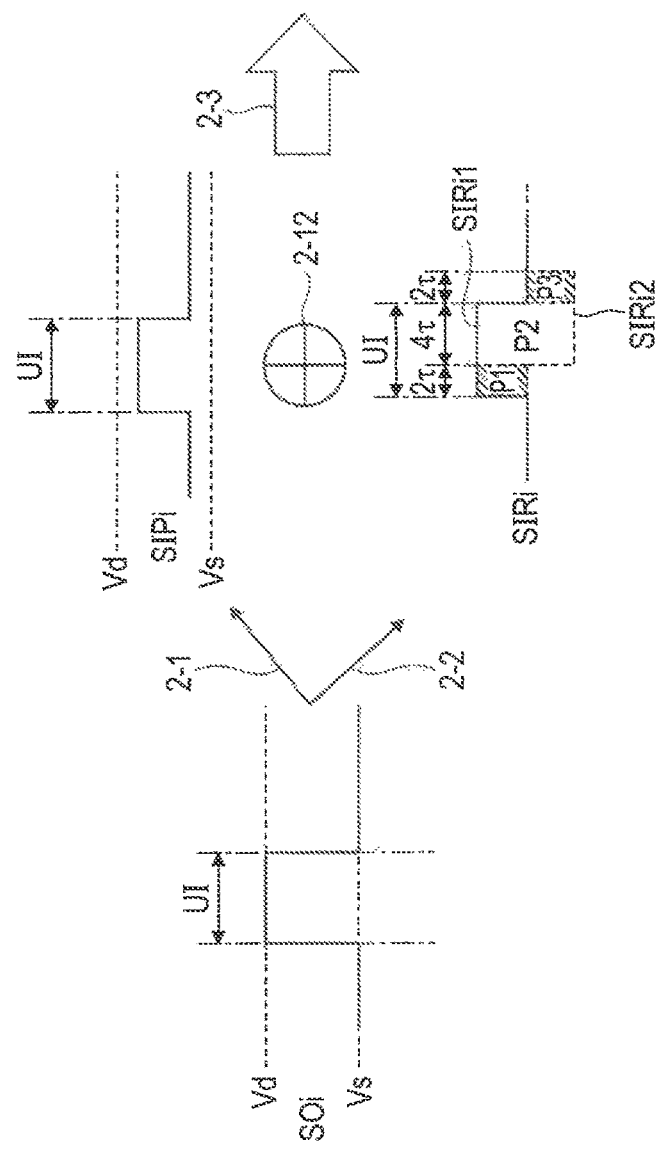

FIG. 15A

| Rate (Gbps) | 1 | | | | | | | | |
|---|---|---|---|---|---|---|---|---|---|
| UI (ps) | 1000 | | | | | | | | |
| $\varepsilon_r$ | 3.2 | | | | | | | | |
| n | 2 | 3 | 4 | 5 | 6 | 7 | 8 | 9 | 10 |
| $L_n$ (mm) | 41.93 | 27.95 | 20.96 | 16.77 | 13.98 | 11.98 | 10.48 | 9.32 | 8.39 |

FIG. 15B

| Rate (Gbps) | 2 | | | | | | | | |
|---|---|---|---|---|---|---|---|---|---|
| UI (ps) | 500 | | | | | | | | |
| $\varepsilon_r$ | 3.2 | | | | | | | | |
| n | 2 | 3 | 4 | 5 | 6 | 7 | 8 | 9 | 10 |
| $L_n$ (mm) | 20.96 | 13.98 | 10.48 | 8.39 | 6.99 | 5.99 | 5.24 | 4.66 | 4.19 |

FIG. 15C

| Rate (Gbps) | 4 | | | | | | | | |
|---|---|---|---|---|---|---|---|---|---|
| UI (ps) | 250 | | | | | | | | |
| $\varepsilon_r$ | 3.2 | | | | | | | | |
| n | 2 | 3 | 4 | 5 | 6 | 7 | 8 | 9 | 10 |
| $L_n$ (mm) | 10.48 | 6.99 | 5.24 | 4.19 | 3.49 | 2.99 | 2.62 | 2.33 | 2.10 |

FIG. 16A

| Rate (Gbps) | 1 | | | | | | | | |
|---|---|---|---|---|---|---|---|---|---|
| UI (ps) | 1000 | | | | | | | | |
| $\varepsilon_r$ | 4.2 | | | | | | | | |
| n | 2 | 3 | 4 | 5 | 6 | 7 | 8 | 9 | 10 |
| $L_n$ (mm) | 36.60 | 24.40 | 18.30 | 14.64 | 12.20 | 10.46 | 9.15 | 8.13 | 7.32 |

FIG. 16B

| Rate (Gbps) | 2 | | | | | | | | |
|---|---|---|---|---|---|---|---|---|---|
| UI (ps) | 500 | | | | | | | | |
| $\varepsilon_r$ | 4.2 | | | | | | | | |
| n | 2 | 3 | 4 | 5 | 6 | 7 | 8 | 9 | 10 |
| $L_n$ (mm) | 18.30 | 12.20 | 9.15 | 7.32 | 6.10 | 5.23 | 4.57 | 4.07 | 3.66 |

FIG. 16C

| Rate (Gbps) | 4 | | | | | | | | |
|---|---|---|---|---|---|---|---|---|---|
| UI (ps) | 250 | | | | | | | | |
| $\varepsilon_r$ | 4.2 | | | | | | | | |
| n | 2 | 3 | 4 | 5 | 6 | 7 | 8 | 9 | 10 |
| $L_n$ (mm) | 9.15 | 6.10 | 4.57 | 3.66 | 3.05 | 2.61 | 2.29 | 2.03 | 1.83 |

SEMICONDUCTOR DEVICE

CROSS-REFERENCE TO RELATED APPLICATIONS

The disclosure of Japanese Patent Application No. 2016-254120 filed on Dec. 27, 2016 including the specification, drawings and abstract is incorporated herein by reference in its entirety.

BACKGROUND

The present invention relates to a semiconductor device and to a semiconductor device equipped with a plurality of wirings disposed in an interposer or a wiring substrate using an organic material as a dielectric, for example.

It has been known that a plurality of semiconductor chips are mounted over an interposer and sealed into a single package, followed by being provided as a semiconductor device. One example of such a semiconductor device is a so-called SIP (System In Package) or MCM (Multi-Chip Module).

On the other hand, there has recently been an increasing strong demand for speeding-up and high integration of a semiconductor device. To meet this demand, there has been considered that, for example, memory semiconductor chips (memory chips) are three-dimensionally (3-D) stacked on each other and logical semiconductor chips are mounted onto the same interposer, and the 3-D memory chips and the logical semiconductor chips (logical chips) are coupled in parallel therebetween by a large number of wirings disposed in the interposer. Since the three-dimensionally stacked semiconductor chips and the two-dimensionally arranged semiconductor chips are coupled therebetween, such a semiconductor device is also called a 2.5-dimensional (2.5-D) semiconductor device.

Amounting structure of a high-speed signal transmission wiring has been described in Patent Document 1.

RELATED ART DOCUMENTS

Patent Document

[Patent Document 1] Japanese Unexamined Patent Publication Laid-Open No. 2001-111408

SUMMARY

In order to achieve speeding-up, the number (or the present signal-wiring number) of signal wirings (hereinafter also called bus wirings) which couple the 3-D memory chips and the logical chips on a parallel basis reaches even 1 Kbit (1024 bits), for example. That is, the width (bus width) of each bus wiring coupling between the chips has been made as wide as 1 Kbit. By enlarging the bus width in this manner, the total data transfer rate between the 3-D memory chips and the logical chips reaches even 2 Tbps when the data transfer rate per signal wiring is 2 Gbps, thereby making it possible to achieve the speeding-up. It is effective that to enlarge the bus width, the respective chips (dies) are mounted in the same interposer rather than sealing them into separate packages and coupling them by using external wirings at the outside of the packages, and the chips are coupled using wirings of the interposer, which are narrower in wiring width than the external wirings.

The interposer can be formed of, for example, a silicon wafer. In this case, the wirings disposed in the interposer can be formed of a wiring layer formed in the silicon wafer by using, for example, the known semiconductor manufacturing technology. It is possible to form high-density wirings by, for example, performing etching processing or the like on the wiring layer of the silicon wafer. The silicon interposer put into practice use at present is formed using, for example, a silicon wafer whose thickness ranges from about 50 to 100 μm (where μm will hereinafter be also called um). The 3-D memory chips and the logical chips are mounted onto such a silicon interposer and coupled by the high-density wirings disposed (formed) in the silicon interposer, thereby making it possible to realize a wide bus width. In this case, the silicon interposer is mounted onto a support package substrate formed with low-density wirings, and, for example, the terminals of amounted chip and the wirings of the support package substrate are coupled therebetween by TSV (Through Silicon Via) electrically coupling between the main and back surfaces of the silicon interposer.

Since the silicon interposer is formed using the semiconductor manufacturing technology, a wiring thickness can be made very thin, and a wiring width can be made narrow. A description will be made of one example. When seen in plan view, the wiring width can be made to range from 0.5 to 2.0 um, and the wiring thickness can be made to 1.0 um or so. Further, the wirings can be three-dimensionally arranged in the silicon interposer by forming multilayered wiring layers in the silicon wafer. That is, when seen in sectional view, the wirings are disposed above and below the silicon with the silicon interposed therebetween as a dielectric. In this case, the distance between the upper and lower wirings, i.e., the distance between the adjacent wirings can be made to, for example, 0.5 um or so.

The bus wirings which couple between the chips are configured by the wirings three-dimensionally disposed in the silicon interposer. In this case, a plurality of voltage wirings are respectively disposed so as to be parallel to the three-dimensionally disposed bus wirings and be interposed between the bus wirings. The voltage wirings are supplied with a predetermined voltage like, for example, a ground voltage. The voltage wirings are used as shield wirings for preventing signals from interfering (crosstalk) between the bus wirings. Since the silicon interposer can be made high in wiring density, the distance between the shield and bus wirings can be shortened, and hence the crosstalk can effectively be reduced by the shield wirings. Further, since the cross-sectional area of each wiring is small, the electrical resistance per unit length becomes large. Therefore, the bus wirings themselves act as series termination resistors coupling between the chips. As a result, although a signal waveform transmitted between the chips becomes blunt, a reflected wave of a signal can be reduced, so that an excellent signal can be transmitted.

On the other hand, since the electrical resistance per unit length is large, the wiring length is required to be made short and any restriction is imposed when laying out the bus wirings, where the signal wirings are used as the bus wirings each of which transmits a relatively high-speed signal. The silicon interposer is obtained by forming it in one silicon wafer in large numbers and thereafter cutting the silicon wafer by the semiconductor manufacturing technology. Since the silicon interposer is formed using the semiconductor manufacturing technology, the unit price of the silicon wafer formed with the silicon interposers becomes high and hence the unit price of the silicon interposer also becomes high.

Thus, the present inventors have examined that an interposer (hereinafter also called an organic interposer) formed of an organic material like a resin instead of silicon is used, and wirings disposed in the organic interposer are used as signal wirings (bus wirings). That is, the present inventors have examined that the 3-D memory chips and the logical chips are mounted in the organic interposer, and the chips are coupled to each other therebetween with the wirings disposed in the organic interposer as the bus wirings. In this case, instead of the silicon, the organic material functions as a dielectric interposed between the bus wirings. Upon forming organic interposers, for example, wirings are formed in an organic material (resin) and a layer of the organic material formed with the wirings is stacked in plural layers to form a large organic panel. In this case, a large number of organic interposer are formed in one organic panel, and many organic interposers are obtained by cutting the organic panel.

Since the large organic panel can be formed by stacking the inexpensive organic materials on each other, it becomes lower in cost than the silicon wafer. As a result, the organic interposer also becomes lower in cost than the silicon interposer. On the other hand, since it is difficult to form the organic interposer so as to be made narrow in wiring width and thin in wiring thickness as in the silicon interposer, the wiring density is made lower than that at the silicon interposer. Since the cross-sectional area of the wiring becomes large, the electrical resistance per unit length can be made small. As compared with the silicon interposer, the organic interposer is capable of transmitting a high-speed signal even though wirings each having a remarkably long wiring length are used. As a result, it is possible to relax a limitation of layout of the bus wirings.

Since, however, the wiring density is low when each wiring disposed in the organic interposer is used as the bus wiring, the distance between the shield wiring and the bus wiring becomes long. Further, since the electrical resistance is low, a change in signal waveform becomes steep. As a result, a problem arises in that crosstalk between bus signals becomes large.

There has been described in Patent Document 1, a technology of suppressing a temporal fluctuation caused by a reflected wave which goes back and forth over a wiring for transmission to reduce jitter. That is, Patent Document 1 simply describes the technology of satisfactorily keeping a signal waveform at one wiring and does not describe interference of signals between a plurality of bus wirings. Further, the organic interposer is not completely disclosed either.

Other objects and novel features of the present invention will become apparent from the description of the present specification and the accompanying drawings.

A semiconductor device according to one aspect of the present invention is equipped with a first signal wiring disposed in an organic interposer or an organic wiring substrate and equipped with a first end and a second end, a second signal wiring which is disposed in the organic interposer or the organic wiring substrate and transmits a signal, a first output circuit having an output terminal coupled to the first end of the first signal wiring, a first input circuit having an input terminal coupled to the second end of the first signal wiring, a second output circuit which is coupled to the second signal wiring and outputs a signal to the second signal wiring, and a second input circuit which is coupled to the second signal wiring and inputs the signal at the second signal wiring therein. Here, the first output circuit sets an impedance at the output terminal so as to generate a reflected wave in a direction opposite in phase to a waveform transmitted to the first end and periodically outputs data to the output terminal. Also, the first input circuit sets an impedance at the input terminal so as to generate a reflected wave in the same phase direction as a waveform transmitted to the second end. Further, the first signal wiring is set in such a manner that the average of a dynamic signal delay time between the first and second ends of the first signal wiring becomes 1/integer of 2 or more with respect to a half of a cycle of the data. Besides, a difference between the maximum and minimum values of a dynamic signal delay time at the second signal wiring is set so as not to exceed twice the average delay. Here, the term "dynamic" means that the dynamic signal delay time includes a temporal fluctuation (jitter) in a signal at one signal wiring. The term "static" to be described later means that a static signal delay time does not include a temporal fluctuation in a signal at one signal wiring.

Further, a semiconductor device according to another aspect of the present invention is equipped with a plurality of wiring bundles disposed in an organic interposer or an organic wiring substrate and each having a clock signal wiring transmitting a clock signal and a plurality of signal wirings each transmitting a signal in sync with the clock signal. Here, one of the wiring bundles is equipped with a first signal wiring equipped with a first end and a second end, and a second signal wiring and a third signal wiring disposed so as to be parallel to the first signal wiring. Also, the semiconductor device is equipped with an output circuit which has an output terminal coupled to the first end of the first signal wiring and which sets an impedance at the output terminal so as to generate a reflected wave in a direction opposite in phase to a waveform transmitted to the first end and periodically outputs data to the output terminal, and an input circuit which has an input terminal coupled to the second end of the first signal wiring and sets an impedance at the input terminal so as to generate a reflected wave in the same phase direction as a waveform transmitted to the second end. Further, the first signal wiring is set in such a manner that an average delay between the first and second ends of the first signal wiring becomes 1/integer of 2 or more with respect to a half of a cycle of the data. The second signal wiring and the third signal wiring are set in such a manner that a difference between a signal delay at the second signal wiring and a signal delay at the third signal wiring does not exceed twice the average delay.

According to one aspect of the present invention, it is possible to provide an inexpensive semiconductor device capable of suppressing the influence by crosstalk while suppressing enlargement of a wiring interval or a reduction in wiring density.

BRIEF DESCRIPTION OF THE DRAWINGS

FIGS. 2A through 2C are respectively diagrams for describing the data transmission according to the embodiment 1;

FIGS. 14A through 14C are respectively diagrams for describing data transmission according to a modification of the embodiment 1;

FIGS. 15A through 15C are respectively diagrams showing wiring lengths of signal wirings according to the embodiment 1;

FIGS. 16A through 16C are respectively diagrams showing wiring lengths of signal wirings according to the embodiment 1;

DETAILED DESCRIPTION

Figure 1A:
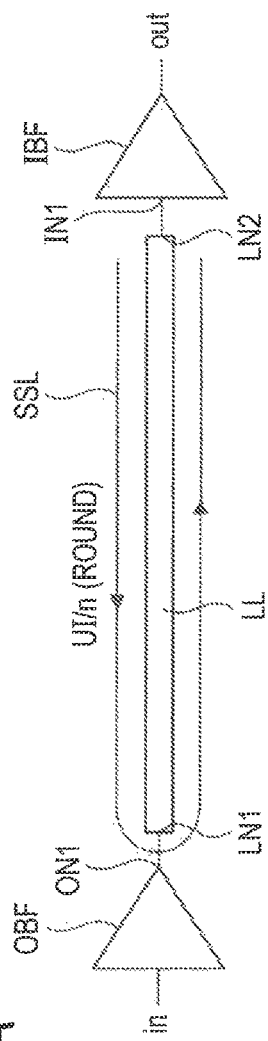
FIGS. 1A and 1B are respectively diagrams for describing a basic configuration of data transmission according to an embodiment 1.

Embodiments of the present invention will hereinafter be described in detail based on the accompanying drawings. Incidentally, in all of the drawings for explaining the embodiments, the same reference numerals are respectively attached to the same components in principle, and their repetitive description will be omitted in principle.

Embodiment 1

<Basic Configuration of Data Transmission>

A basic configuration of data transmission, which is built in a semiconductor device according to an embodiment 1 will first be described. The semiconductor device to which the basic configuration of data transmission to be described here is applied will be described later by using an example.

FIG. 1 is a diagram describing a basic configuration of data transmission according to the embodiment 1. FIG. 1A is a typical block diagram showing the configuration of data transmission. In FIG. 1A, LL indicates a signal wiring (first signal wiring) equipped with a pair of ends LN1 and LN2 (where LN1 is also called a "first end" and LN2 is also called a "second end" hereinafter), OBF indicates an output circuit (first output circuit), and IBF indicates an input circuit (first input circuit). Although not restricted in particular, the output circuit OBF is an output buffer circuit, and the input circuit IBF is an input buffer circuit. The signal wiring LL according to the embodiment 1 is comprised of wirings disposed in an organic interposer. The output circuit OBF and the input circuit IBF are formed in a chip mounted over the organic interposer.

The output circuit OBF is equipped with an output terminal ON1. The output terminal ON1 is electrically coupled to the first end LN1 of the signal wiring LL. The input circuit IBF is equipped with an input terminal IN1. The input terminal IN1 is electrically coupled to the second end LN2 of the signal wiring LL.

The output circuit OBF is supplied with input data in and supplies a signal waveform corresponding to the input data in to the first end IN1. The signal waveform supplied to the first end IN1 are propagated through the signal wiring LL and reaches the second end LN2. The input circuit IBF receives the signal waveform at the second end LN2 of the signal wiring LL and forms and outputs output data out corresponding to the received signal waveform.

In the embodiment 1, the output circuit OBF is supplied with cyclic data as the input data in. The input data in is binary data, for example. When the logical value of the binary data is "1", a voltage corresponding to the logical value "1" is supplied to the output circuit OBF as the input data in for a predetermined period. Likewise, when the logical value of the binary data is "0", a voltage corresponding to the logical value "0" is supplied to the output circuit OBF as the input data in for the predetermined period. The above predetermined period taken as the voltage corresponding to the logical value corresponds to one cycle of the input data in. Therefore, when the logical value of the input data in is consecutive on a time series basis like "1", "1" (or "0", "0"), for example, the output circuit OBF is supplied with the voltage corresponding to the logical value "1" ("0") over two cycles of the input data in. On the other hand, when the logical value is changed to "1", "0" (or "0", "1"), the output circuit OBF is supplied with the voltage corresponding to the logical value "1" ("0") during one cycle and supplied with the voltage corresponding to the logical value "0" ("1") during one cycle at the next timing.

Figure 1B:
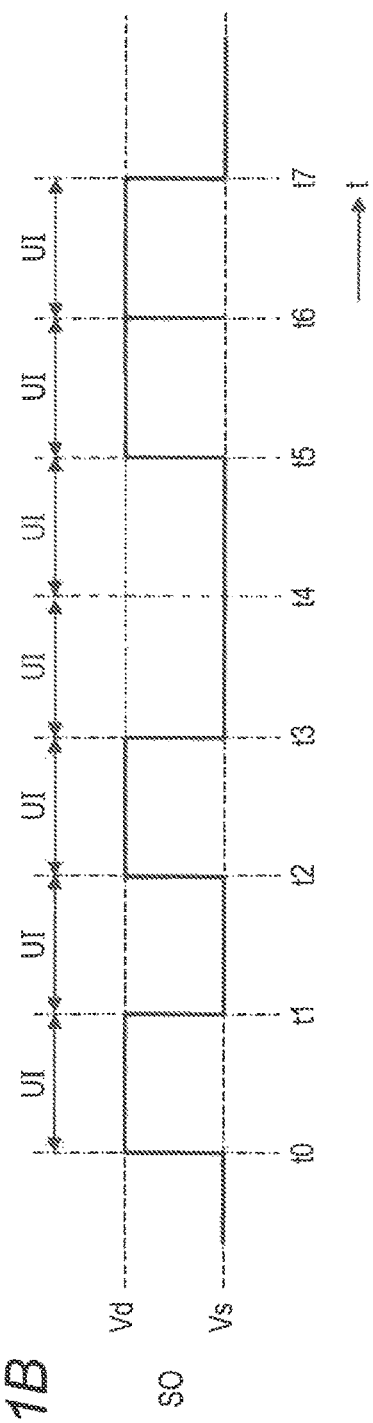

The output circuit OBF supplies the signal waveform corresponding to the cyclic input data in from the output terminal ON1 to the first end LN1. Therefore, the cycle of the signal waveform supplied to the first end LN1 also becomes the same as the cycle of the input data in. FIG. 1B is a waveform diagram showing a signal waveform SO supplied from the output terminal ON1 of the output circuit OBF to the first end LN1. In FIG. 1B, the horizontal axis indicates the time, and the vertical axis indicates the voltage.

In FIG. 1B, there is drawn as an example, a signal waveform SO where logical values "1, 0, 1, 0, 0, 1, and 1" are supplied as input data in between times t0 and t7. Since the output circuit OBF is comprised of the output buffer circuit, the output data output from the output terminal ON1 of the output circuit OBF becomes the same logical value as the input data in. In FIG. 1B, during a period in which the output data is of the logical value "1", the voltage of the signal waveform SO at the output terminal ON1 becomes Vd. During a period in which the output data is of the logical value "0", the voltage of the signal waveform SO at the output terminal ON1 becomes Vs. Therefore, when the logical value of the input data in is changed as described above, the voltage at the output terminal ON1 is changed as indicated by a solid line in FIG. 1B. In FIG. 1B, UI indicates a period of the logical value of the data (output data) output to the output terminal ON1 and shows one cycle of the data output from the output circuit OBF.

Thus, the voltage corresponding to the logical value of the output data to be output is supplied from the output terminal ON1 to the first end LN1 of the signal wiring LL during the period of the cycle UI of the data. Since the output circuit OBF supplies the output data complying with the input data in to the first end LN1 on a time series basis, the signal waveform SO of the voltage corresponding to the logical value of the input data in is supplied to the first end LN1. The signal waveform SO propagates through the signal wiring LL and reaches the second end LN2.

The input circuit IBF forms output data out corresponding to the signal waveform SO which reaches the second end LN2. In this case, when the impedance (impedance of second end LN2) as the signal wiring LL is viewed from the second end LN2 and the impedance (impedance of input terminal IN1) as the input circuit IBF is viewed from the input terminal IN1 are not matched with each other in a state in which the input terminal IN1 is not coupled, impedance mismatching occurs so that a reflected wave is generated at the second end LN2.

<Reflected Wave and Re-Reflected Wave>

When the impedance of the second end LN2 matches with the impedance of the input terminal IN1, the reflected wave based on the signal waveform SO which reaches the second end LN2 of the signal wiring LL is not generated, and hence the signal waveform SO is propagated into the input circuit IBF. On the other hand, when the impedance of the second end LN2 and the impedance of the input terminal IN1 does not match, the reflected wave headed from the second end LN2 to the first end LN1 is generated at the signal wiring LL.

In this case, when the impedance of the input terminal IN1 is larger than that of the second end LN2, a reflected wave having a phase in the same phase direction as the signal waveform SO which reaches the second end LN2 is generated. In principle, as the impedance of the input terminal IN1 becomes high, the phase of the reflected wave approaches the phase of the signal waveform SO which reaches the second end LN2. When the impedance of the input terminal IN1 becomes close to infinity, a reflected wave of the same phase as that of the signal waveform SO which reaches the second end LN2 is generated.

On the other hand, when the impedance of the input terminal IN1 is smaller than that of the second end LN2, a reflected wave having a phase in a direction antiphase to the signal waveform SO which reaches the second end LN2 is generated. That is, as the impedance of the input terminal IN1 becomes small, the phase of the reflected wave approaches a phase directly opposite to the signal waveform SO which reaches the second end LN2. When the impedance of the input terminal IN1 approaches 0, a reflected wave having a phase which is directly opposite (anti-phase) to the signal waveform SO which reaches the second end LN2 is yielded.

The reflected wave generated at the second end LN2 is propagated through the signal wiring LL and reaches the first end LN1. When the impedance (impedance of first end LN1) as the signal wiring LL is viewed from the first end LN1 in a state in which the first end LN1 is not coupled to the output terminal ON1, and the impedance (impedance of output terminal ON1) as the output circuit OBF is viewed from the output terminal ON1 in a state in which the first end LN1 is discoupled, are mismatched with each other, a re-reflected wave is generated. That is, when the impedance of the first end LN1 and the impedance of the output terminal ON1 are mismatched, a reflected wave based on the reflected wave which reaches the first end LN1 is generated. In the present specification, in order to distinguish between the reflected wave and the reflected wave based on the reflected wave, the reflected wave based on the reflected wave is also called a re-reflected wave.

The re-reflected wave generated at the first end LN1 propagates toward the second end LN2 through the signal wiring LL. The phase of the propagated re-reflected wave is determined depending on the magnitude of the impedances of the first end LN1 and the output terminal ON1 as with the above-described phase of reflected wave. That is, when the impedance of the output terminal ON1 is larger than that of the first end LN1, the phase of the re-reflected wave assumes the same phase direction as the reflected wave. When the impedance of the output terminal ON1 approaches infinity, a re-reflected wave is generated with the same phase as the reflected wave in principle. On the contrary, when the impedance of the output terminal ON1 is smaller than that of the first end LN1, the phase of the re-reflected wave assumes the direction antiphase to the reflected wave. When the impedance of the output terminal ON1 approaches 0, a re-reflected wave having a phase opposite to that of the reflected wave is generated in principle.

When the impedance is mismatched between the second end LN2 and the input terminal IN1, a reflected wave (re-re-reflected wave) is further generated based on the re-reflected wave which propagates through the signal wiring LL and reaches the second end LN2. That is, the reflection is repeated between the first end LN1 and the second end LN2, thus resulting in the occurrence of multi-reflection. Since a loss exists in the signal wiring LL, the signal wave, reflected wave, re-reflected wave and re-re-reflected wave, etc. which are propagated through the signal wiring LL, are attenuated. Since the reflected wave (re-re-reflected wave or the like) generated by repeating reflection becomes large in attenuation, a description will be made of up to the re-reflected wave as an example in the present specification.

Further, the signal wiring LL has, for example, a parasitic resistance component, a parasitic capacitance component and a parasitic inductance component determined by its sectional area, wiring length, quality of material and arrangement, etc. Therefore, the signal wiring LL has a signal delay time $\tau$ determined by these components. For example, the signal waveform SO supplied to the first end LN1 reaches the second end LN2 with being delayed by the signal delay time $\tau$ that the signal wiring LL has. Likewise, the reflected wave generated at the second end LN2 reaches the first end LN1 with being delayed by the signal delay time $\tau$ of the signal wiring LL, and the re-reflected wave generated at the first end LN1 also reaches the second end LN2 with being delayed by the signal delay time $\tau$.

<Configurations of Input Circuit and Output Circuit>

Figure 3A:
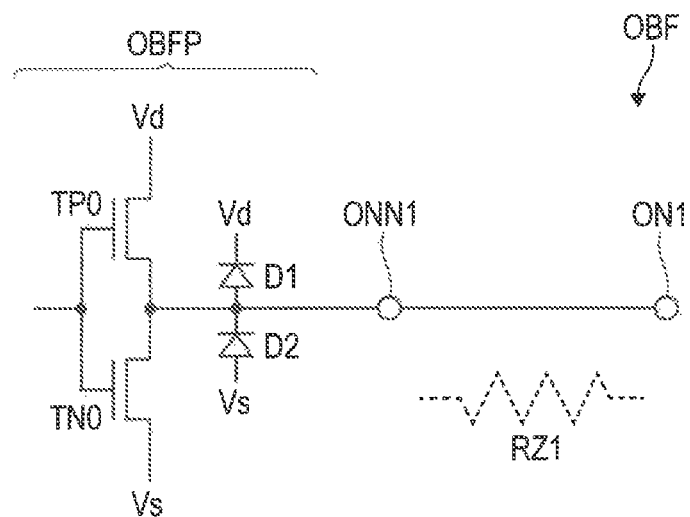
FIGS. 3A and 3B are respectively circuit diagrams showing an input circuit and an output circuit according to the embodiment 1.
Figure 3B:
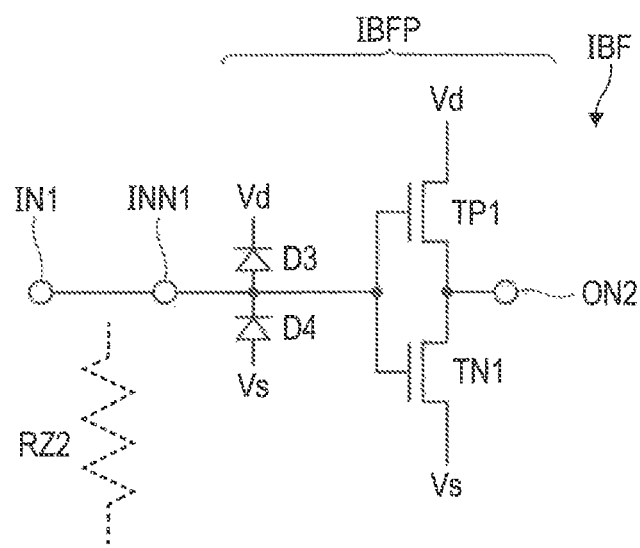

In the embodiment 1, the impedance of the output terminal ON1 of the output circuit OBF is set to be smaller than that of the first end LN1. On the other hand, the impedance of the input terminal IN1 of the input circuit IBF is set to be larger than that of the second end LN2. Normally, in order to prevent the reflected wave and the re-reflected wave from being generated, the input circuit IBF and the output circuit OBF are respectively provided with a termination resistor for achieving impedance matching. On the other hand, each of the input circuit IBF and the output circuit OBF according to the embodiment 1 does not have the termination resistor. The configurations of the input circuit IBF and the output circuit OBF will be described with reference to FIG. 3. FIG. 3 is a circuit diagram showing the configurations of the input circuit and the output circuit according to the embodiment 1. Here, FIG. 3A shows the configuration of the output circuit OBF, and FIG. 3B shows the configuration of the input circuit IBF.

The output circuit OBF is provided with an output circuit part OBFP which forms a signal waveform complying with the input data in. The output circuit part OBFP is comprised of a plurality of P channel type transistors (hereinafter also called P-type transistors) and a plurality of N channel type transistors (hereinafter also called N-type transistors). There are, however, shown in FIG. 3A only a P-type transistor TP0 and an N-type transistor TN0 coupled to an output terminal ONN1 of the output circuit part OBFP. The P-type transistor TP0 and the N-type transistor TN0 respectively have source-drain paths coupled in series between a voltage Vd and a voltage Vs. Further, their gates are coupled in common and supplied with an input signal from an unillustrated previous stage. A CMOS type inverter circuit is configured by the P-type transistor TP0 and the N-type transistor TN0.

The output of the CMOS type inverter circuit is coupled to the output terminal ONN1. Further, protective diodes D1 and D2 are coupled between the output terminal ONN1 and the voltages Vd and Vs. Thus, the signal complying with the input data in from the unillustrated previous stage is supplied to the CMOS type inverter circuit. The output of the CMOS type inverter circuit is supplied to the output terminal ONN1. Normally, a termination resistor (series termination resistor) RZ1 indicated by a broken line is coupled in series between the output terminal ON1 of the output circuit OBF and the output terminal ONN1 of the output circuit part OBFP. When the P-type transistor TP0 or the N-type transistor TN0 is brought into an on state by coupling the termination resistor RZ1 in series, the series termination resistor RZ1 is interposed between the voltage Vd or Vs and the output terminal ON1, so that the impedance of the output terminal ON1 can be increased. Increasing the impedance enables achievement of impedance matching.

On the other hand, in the embodiment 1, no termination resistor RZ1 is coupled between the output terminal ONN1 of the output circuit part OBFP and the output terminal ON1 of the output circuit OBF. Thus, when the P-type transistor TP0 or the N-type transistor TN0 is brought into the on state, the impedance of the output terminal ON1 is set to be small.

Further, the input circuit IBF is equipped with an input circuit part IBFP which forms output data out. The input circuit part IBFP is also configured by a plurality of P-type transistors and N-type transistors. There is, however, shown in FIG. 3B only a P-type transistor TP1 and an N-type transistor TN1 coupled to an input terminal INN1 of the input circuit part IBFP. As the P-type transistor TP1 and the N-type transistor TN1 configure a CMOS type inverter circuit, their source-drain paths are coupled between voltages Vd and Vs, and their gates are coupled to the input terminal INN1. Further, the input circuit part IFBP is equipped with protective diodes D3 and D4 coupled between the input terminal INN1 and the voltages Vd and Vs.

The input terminal INN1 of the input circuit part IBFP and the input terminal IN1 of the input circuit IBF are electrically coupled therebetween. Normally, in FIG. 3B, a termination resistor (parallel termination resistor) RZ2 indicated by a broken line is coupled between the input terminals IN1 and INN1 and the voltage Vs, for example. In this case, since the N-type transistor TN1 and the termination resistor RZ2 are coupled in parallel, the impedance of the input terminal IN1 can be made small, thereby enabling achievement of impedance matching.

On the other hand, in the embodiment 1, no termination resistor RZ2 is coupled between the input terminals IN1 and INN2 and the voltage Vs (Vd). Thus, it is possible to increase the impedance of the input terminal IN1.

Incidentally, the protective diode D1 through D4 may be eliminated to set the impedances of the output terminal ON1 and the input terminal IN1 to a desired value.

<Basic Principle of Data Transmission>

FIG. 2 is an explanatory diagram for describing the data transmission according to the embodiment 1. Here, FIG. 2A shows a signal waveform supplied from the output terminal ON1 of the output circuit OBF shown in FIG. 1A to the first end LN1. In FIG. 2A, the horizontal axis indicates the time, and the vertical axis indicates the voltage. Although the signal waveform SO corresponding to the continuous logical values is supplied to the first end LN1 as shown in FIG. 1B, there is drawn in FIG. 2A only a signal waveform SOi corresponding to one logical value to provide easier description.

FIG. 2B is a diagram for describing the synthesis of signal waveforms at the second end LN2. Arrows 2-1 and 2-2 shown between FIGS. 2A and 2B indicate that a signal waveform SIPi shown on the upper side of FIG. 2B and a signal waveform SIRi shown on the lower side thereof are based on the signal waveform SOi. Further, reference numeral 2-12 drawn between the signal waveforms SIPi and SIRi in FIG. 2B indicates that the signal waveforms SIPi and SIRi are synthesized.

FIG. 2C is a diagram for describing a signal waveform synthesized at the second end LN2. Reference numeral 2-3 shown between FIG. 2B and FIG. 2C indicates that a signal waveform shown in FIG. 2C is formed by the synthesis 2-12. Incidentally, even in FIGS. 2B and 2C, the horizontal axis indicates the time, and the vertical axis indicates the voltage.

A basic principle of the data transmission according to the embodiment 1 will be described using FIGS. 1 and 2.

In the embodiment 1, the delay time (signal delay time) τ of the signal at the signal wiring LL, i.e., the signal delay time propagated between the first end LN1 and the second end LN2 is set to a value obtained by dividing half of the cycle UI of the data supplied to the signal wiring LL by 1/integer (integer variable) n of 2 or more. Representing the relationship between the signal delay time τ and the cycle UI of the data in a numerical formula yields the following equation (1):

$$\tau \approx \frac{UI}{2n}; n = 2, 3, 4, \ldots \tag{1}$$

Here, n is an integer of 2 or more. When the signal waveform SOi is considered to travel back and forth (SSL) over the signal wiring LL as shown in FIG. 1A, a round time delay 2τ becomes a cycle UI/integer n.

For example, when the integer n is 2, the signal delay time τ becomes UI/(2×2), and the signal delay time τ is set to about ¼ of the cycle UI of the data. A description will be made here of, as an example, a case where the wiring length of the signal wiring LL, i.e., the length between the first end LN1 and the second end LN2 is adjusted to set the signal delay time τ at the signal wiring LL to be about ¼ of the cycle UI of the data. When it is considered that the signal waveform SOi travels back and forth, the round signal delay time 2τ is set to be about ½ of the cycle UI of the data.

The signal waveform SIPi in FIG. 2B indicates the waveform of the signal waveform SOi which is propagated through the signal wiring LL and reaches the second end LN2. As shown in FIG. 2A, the signal waveform SOi is a waveform which changes from the voltage Vs to Vd and which is maintained at the voltage Vd only for the period of the cycle UI of the data and thereafter changes to the voltage Vs. According to the example of FIG. 1, the signal waveform SOi is a signal waveform equivalent to a logical value "1". Since the loss exists in the signal wiring LL, the amplitude of the signal waveform SOi becomes small when the signal waveform SOi is propagated through the signal wiring LL and reaches the second end LN2. Therefore, in FIG. 2B, the signal waveform SIPi changes between a voltage higher than the voltage Vs and a voltage lower than the voltage Vd. Further, the signal waveform SIPi is changed with being delayed by the signal delay time τ of the signal wiring LL as compared with a change in the signal waveform SOi.

In FIG. 2B, a signal waveform SIRi1 indicated by a solid line indicates a reflected wave based on the signal waveform SIPi which reaches the second end LN2. A signal waveform SIRi2 indicated by a broken line indicates a re-reflected wave which reaches the second end LN2. Since the impedance of the input terminal IN1 is set large, the reflected wave (signal waveform SIRi1) has a phase being in phase with (in the same phase direction as) the signal waveform SIPi and is generated substantially simultaneously with the signal waveform SIPi.

The reflected wave (signal waveform SIRi1) is propagated from the second end LN2 to the first end LN1 over the signal wiring LL and reaches the first end LN1 after the signal delay time τ. Since, at this time, the impedance of the output terminal ON1 is set small, the phase of the re-reflected wave generated by impedance mismatching becomes a phase in a direction opposite to the phase of the reflected wave (signal waveform SIRi1). The re-reflected wave is propagated from the first end LN1 to the second end LN2 through the signal wiring LL and reaches the second end LN2 after the signal delay time τ. The time during which the reflected wave (SIRi1) generated at the second end LN2 travels back and forth over the signal wiring LL and reaches the second end LN2 as the re-reflected wave (SIRi2) becomes a double signal delay time 2τ (round signal delay time of signal wiring LL). At this time, the phase of the re-reflected wave SIRi2 which reaches the second end LN2 becomes a phase in a direction opposite to the phase of the reflected wave SIRi1. That is, the re-reflected wave SIRi2 synthesized at the second end LN2 is delayed by the sigma delay time 2τ with respect to the reflected wave SIRi1 and has a voltage antiphase to the reflected wave.

In FIG. 2B, after the reflected wave (SIRi1) is changed to the voltage Vd side, the re-reflected wave (SIRi2) is delayed by the signal delay time 2τ and changed to a voltage more negative than the voltage Vs. Further, after the reflected wave (SIRi1) is changed to the voltage Vs side, only the signal delay time 2τ elapses and the re-reflected wave (SIRi2) is changed to the voltage Vd. At the second end LN2, the reflected wave (SIRi1) and the re-reflected wave (SIRi2) are synthesized so that a signal waveform SIRi being the synthesized reflected wave is generated. Described schematically, in FIG. 2B, the voltage of the reflected wave (SIRi1) and the voltage of the re-reflected wave (SIRi2) are superposed on each other during a hatched period P1, so that the voltage of the signal waveform SIRi rises to the voltage Vd side. Likewise, even during a hatched period P3, the voltage of the reflected wave (SIRi1) and the voltage of the re-reflected wave (SIRi2) are superposed on each other, but the voltage of the signal waveform SIRi is lowered to the voltage Vs side. On the other hand, during a period P2 between the periods P1 and P3, the voltage of the reflected wave (SIRi1) and the voltage of the re-reflected wave (SIRi2) are cancelled each other so that the voltage of the signal waveform SIRi becomes a value close to the voltage Vs.

At the second end LN2, the signal waveform SIPi and the signal waveform (synthesized reflected wave) SIRi both shown in FIG. 2b are synthesized. With their synthesis, during a period P1 as shown in FIG. 2C, a signal waveform SIPi which is changed to the voltage Vd side and maintains the voltage on the voltage Vd side, and a signal waveform SIRi which is changed to the voltage Vd side and maintains the voltage on the voltage Vd side in like manner are superposed on each other, so that the voltage of a signal waveform SIi at the second end LN2 is changed to a voltage higher than the voltage Vd and maintained at a high voltage. Also, during a period P3, a signal waveform SIPi which is changed to the voltage Vs side and maintains the voltage on the voltage Vs side, and a signal waveform SIRi which maintains a voltage lower than the voltage Vs side and is directed to the voltage Vs side are superposed on each other, so that the voltage of the signal waveform SIi at the second end LN2 becomes lower than the voltage Vs. Further, since the signal waveform SIRi is at a voltage close to the voltage Vs during a period between the periods P1 and P3, the voltage of the signal waveform SIi becomes a voltage (voltage on the Vd side) close to the voltage of the signal waveform SIPi. That is, when the signal waveform is changed at the second end LN2, a horn-shaped change in voltage occurs during the periods P1 and P3 respectively.

Consider where each of other signal wirings (not shown) is disposed in an organic interposer so as to be adjacent to and parallel to the signal wiring LL, and an input circuit (second input circuit) and an output circuit (second output circuit) both not shown are coupled to the other signal wiring (second signal wiring), and a signal is transmitted and received through the second signal wiring. That is, consider where a signal is output from the second output circuit to the second signal wiring, and the signal propagated through the second signal wiring is input to the first input circuit. In this case, it is possible to prevent the signal waveform from being determined as an erroneous logical value (logical value "0" in the example) even though during the period P1 or P3, noise is propagated through the signal wiring LL due to crosstalk from the second signal wiring to thereby change the voltage of the signal waveform SIi at the second end LN2.

For example, when such crosstalk noise as to be directed from the voltage Vd to the voltage Vs is propagated through a parasitic capacitor from the second signal wiring adjacent to the signal wiring LL during the period P1 (signal delay time 2τ), the voltage of the signal waveform SIi at the second end LN2 is changed to the voltage Vs side due to the crosstalk noise. Since, however, the voltage of the signal waveform SIi is higher than the voltage Vd during the period P1, the signal waveform SIi can be maintained at a value close to the voltage Vd even though the voltage of the signal waveform SIi is made low due to the crosstalk noise, thereby making it possible to prevent the input circuit IBF from determining the signal waveform as an erroneous logical value.

Likewise, when such crosstalk noise as to be directed from the voltage Vs to the voltage Vd is propagated from the adjacent second signal wiring, the voltage of the signal waveform SIi is changed to the voltage Vd side during the period P3. Since, however, the voltage of the signal waveform SIi is lower than the voltage Vs during the period P3, the signal waveform SIi can be maintained at a value close to the voltage Vs, thereby making it possible to prevent the input circuit IBF from determining the signal waveform as an erroneous logical value.

In other words, when a difference between the maximum and minimum values of a dynamic signal delay time at the adjacent second signal wiring is not greater than the signal delay time 2τ where first and second signals are made equal to each other in static delay time, it is possible to reduce an influence due to crosstalk based on a change in the signal at the adjacent second signal wiring, thus making it possible to prevent the signal waveform from being determined as an erroneous logical value. That is, the influence due to the crosstalk can be reduced by, for example, setting the wiring length of the second signal wiring and the configurations of the second output circuit and the second input circuit in such a manner that the rising/falling time of the signal at the second signal wiring falls within the section of the signal delay time 2τ.

Further, since the amount of change in the voltage of the signal waveform SIi at the second end LN2 can be made large during the periods P1 and P3, it is possible to improve the rounding of the signal waveform at the signal wiring LL. That is, it is possible to improve the time when the signal waveform SIi rises to the voltage Vd and the time when it falls to the voltage Vs.

In the embodiment 1, the signal wiring LL is configured by the wirings disposed in the organic interposer. Since the organic interposer is small in its wiring resistance, the multi-reflection is generated between the first end and the second end as described above, whereby the influence by the crosstalk can be reduced utilizing the voltages of the reflected wave and the re-reflected wave at the second end LN2. In the embodiment 1, in order to utilize the reflected wave and the re-reflected wave, the signal delay time at the signal wiring LL, the output impedance (impedance of output terminal ON1) of the output circuit OBF, and the input impedance (impedance of input terminal IN1) of the input circuit IBF are set as described above. Normally, in order to achieve impedance matching as described in FIG. 3, the termination resistors RZ1 and RZ2 are respectively coupled to the output circuit OBF and the input circuit IBF. In the embodiment 1, however, no termination resistors RZ1 and RZ2 are coupled thereto. Therefore, power consumed by the termination resistors RZ1 and RZ2 can be reduced, and power-saving of the semiconductor device can also be achieved.

<Simultaneous Switching Output (SSO)>

Although the crosstalk between the signal wiring LL and the signal wiring (second signal wiring) disposed adjacent thereto has been described by way of example, the present embodiment 1 is effective where a plurality of signal wirings are disposed so as to extend in parallel, and signals supplied to the respective signal wirings are changed substantially simultaneously (simultaneous switching output).

Figure 4:
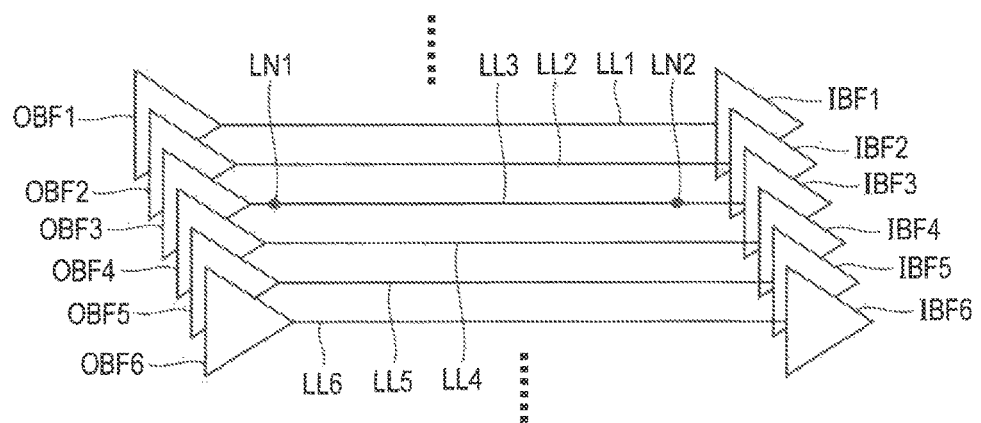
FIG. 4 is a block diagram showing the configuration of bus wirings.

As one example of the simultaneous switching output, there are known bus wirings which couple the previously-mentioned 3-D memory chip and logical chip on a parallel basis. FIG. 4 is a block diagram showing the configuration of the bus wirings. The bus wirings are disposed in an organic interposer so as to extend in parallel to each other. Although, for example, the bus wirings having 1 Kbit are disposed in the organic interposer as described above, six bus wirings of the bus wirings are illustrated as LL1 through LL6 in FIG. 4. Each of the bus wirings LL1 through LL6 corresponds to the signal wiring LL shown in FIG. 1A and has a first end LN1 and a second end LN2. Incidentally, reference numerals LN1 and LN2 are attached only to the bus wiring LL3 in FIG. 4.

In FIG. 4, OBF1 through OBF6 respectively indicate output circuits. Each of the output circuits OBF1 through OBF6 corresponds to the output circuit OBF shown in FIG. 1A. Output terminals (each corresponding to ON1 in FIG. 1) of the output circuits OBF1 through OBF6 are coupled to the first ends LN1 of their corresponding bus wirings LL1 through LL6. Further, IBF1 through IBF6 respectively indicate input circuits. Each of them corresponds to the input circuit IBF in FIG. 1A. Input terminals (each corresponding to IN1 in FIG. 1) of the input circuits IBF1 through IBF6 are coupled to the second ends LN2 of their corresponding bus wirings LL1 through LL6.

Of the two chips mounted in the organic interposer, the input circuits IBF1 through IBF6 are built in one thereof, and the output circuits OBF1 through OBF6 are built in the other chip thereof. The bus wirings LL1 through LL6 are disposed in the organic interposer, and the two chips are electrically coupled in parallel therebetween by the bus wirings LL1 through LL6.

The output circuits OBF1 through OBF6 substantially simultaneously change signal waveforms supplied to the bus wirings LL1 through LL6. Even though the signal waveforms supplied to the bus wirings LL1 through LL6 are respectively changed substantially simultaneously, signal delay times of the signal waveforms which reach the input circuits IBF1 through IBF6 may differ depending on, for example, differences of wiring lengths between the bus wirings LL1 through LL6, etc. Consider where the signal delay times differ. Focusing on one bus wiring, for example, signal waveforms which change previously or/and subsequently on the time basis exist in plural form as compared with a signal propagated through the bus wiring to be noticed. Thus, crosstalk occurs plural times, and crosstalk noise is propagated over the bus wiring to be noticed, over a plurality of number of times. For example, when the bus wiring to be noticed is assumed to be the bus wiring LL3 where it is assumed that the bus wirings LL1 through LL6 are different in signal delay time from each other therebetween, the crosstalk noise of more than once is propagated from the bus wirings LL1, LL2 and LL4 through LL5 to the bus wiring LL3 to be noticed.

<Influence by Antiphase Crosstalk>

Figure 5:
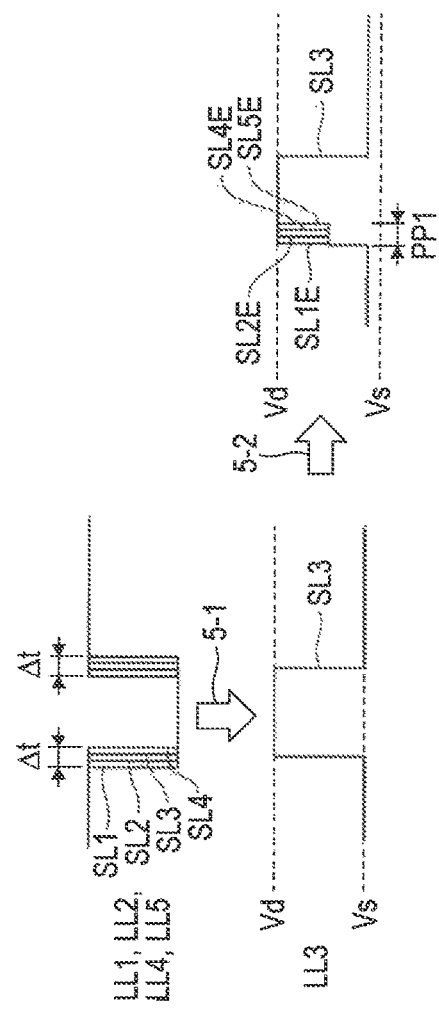
FIGS. 5A through 5C are respectively diagrams for describing an influence by crosstalk.

FIG. 5 is a diagram for describing the influence by crosstalk. FIG. 5A shows signal waveforms propagated through the bus wirings LL1 through LL5 of the bus wirings LL1 through LL6 shown in FIG. 4, and FIG. 5B shows a signal waveform at the second end LN2 of the bus wiring LL3 to be noticed. FIG. 5C shows an eye pattern at the second end LN2 (input terminal of input circuit IBF2) of the bus wiring LL3 to be noticed. Incidentally, in FIGS. 5A through 5C, the horizontal axis indicates the time, and the vertical axis indicates the voltage.

In FIG. 5A, the upper signal waveforms indicate the signal waveforms at the bus wirings LL1, LL2, LL4, and LL5, and the lower signal waveform indicates the signal waveform at the bus wiring LL3 to be noticed. The signal waveform at the bus wiring LL3 to be noticed shown on the lower side of FIG. 5A is a signal waveform unaffected by crosstalk. In FIGS. 5A and 5B, the output circuits OBF1 through OBF5 output the signal waveforms to the bus wirings LL1 through LL5 by the simultaneous switching output. At this time, there is shown a case where the output circuits OBF1, OBF2, OBF4, and OBF5 supply signals being in-phase with each other to the bus wirings LL1, LL2, LL4, and LL5, and the output circuit OBF3 supplies a signal opposite in phase to the signals output by the output circuits OBF1, OBF2, OBF4, and OBF5 to the bus wiring LL3 to be noticed. In this case, the antiphase crosstalk noise is applied from the bus wirings LL1, LL2, LL4, and LL5 to the bus wiring LL3.

That is, when the signal waveform SL3 at the bus wiring LL3 to be noticed is changed from a voltage Vs to a voltage Vd, the signal waveforms SL1, SL2, SL4, and SL5 at the bus wirings LL1, LL2, LL4, and LL5 are changed from the voltage Vd to the voltage Vs, and hence noise in the direction of suppressing a change in the voltage of the signal waveform SL3 at the bus wiring LL3 to be noticed is generated. Likewise, when the signal wiring waveform SL3 at the bus wiring LL3 to be noticed is changed from the voltage Vd to the voltage Vs, the signal waveforms SL1, SL2, SL4, and SL5 at the bus wirings LL1, LL2, LL4, and LL5 are changed from the voltage Vs to the voltage Vd, and hence noise in the direction of suppressing a change in the voltage of the signal waveform SL3 at the bus wiring LL3 to be noticed is generated.

In FIG. 5A, an arrow 5-1 indicates crosstalk. In this case, since the changes in the voltages of the signal waveforms SL1, SL2, SL4, and SL5 become crosstalk noise, the crosstalk indicated by the arrow 5-1 is approximately equivalent to a waveform (differential waveform) obtained by differentiating the changes in the voltages of the signal waveforms SL1, SL2, SL4, and SL5.

When the bus wirings LL1 through LL5 are different in signal delay time from each other, crosstalk noise is generated plural times by the changes in the signal waveforms at the bus wirings LL1, LL2, LL4, and LL5. With the generated crosstalk noise, the signal waveform at the bus wiring LL3 to be noticed is deformed (arrow 5-2), thus resulting in such a signal waveform as shown in FIG. 5B. That is, when the signal waveform SL3 is changed toward the voltage Vd at the second end LN2 of the bus wiring LL3 to be noticed, the change in the voltage of the signal waveform SL3 is suppressed by crosstalk noise SL1E, SL2E, SL4E, and SL5E generated due to changes in the signal waveforms SL1, SL2, SL3, and SL4 toward the voltage Vs. Thus, when the signal waveform SL3 is changed toward the voltage Vd, the signal waveform SL3 becomes a voltage lower than the voltage Vd during an initial period PP1.

Although omitted in FIG. 5B, even when the signal waveform SL3 is changed from the voltage Vd to Vs, the change in the voltage of the signal waveform SL3 is suppressed by the crosstalk noise SL1E, SL2E, SL4E, and SL5E.

Since the change in the voltage of the signal waveform SL3 at the second end LN2 is suppressed during the initial period PP1, the eye pattern becomes low in voltage in a region of EY1 as shown in FIG. 5C and is not brought into a rectangle like the signal waveform SL3 shown in FIG. 5A. When the input circuit IBF3 determines the voltage of the signal waveform SL3 in the region of EY1, it is considered to be determined as an erroneous logical value, thus resulting in the occurrence of a malfunction.

<Reduction in Influence by Antiphase Crosstalk>

In the embodiment 1 as described in FIG. 2, the voltage at the second end LN2 of the signal wiring LL (bus wiring LL3 to be noticed) is set to exceed the voltage Vd during the period P1 and becomes lower than the voltage Vs during the period P3 by using the multi-reflection. Therefore, when the period P1 shown in FIG. 2 is set to be the same as or longer than the period PP1 shown in FIG. 5 and superposed on the period PP1, the voltage of the second end LN2 can be made close to the voltage Vd even though the voltage of the second end LN2 of the bus wiring LL3 is suppressed by the crosstalk noise SL1E, SL2E, SL4E, and SL5E, thereby making it possible to prevent a malfunction from occurring. Likewise, the period during which the change of the voltage of the second end LN2 of the bus wiring LL3 toward the voltage Vs is suppressed by the crosstalk noise SL1E, SL2E, SL4E, and SL5E, and the period P3 shown in FIG. 2C are set to be superposed on each other, thereby enabling the voltage at the second end LN2 of the bus wiring LL3 close to the voltage Vs.

In the present embodiment 1, each bus wiring is set in such a manner that the difference $\Delta t$ between the largest signal delay time (maximum value) of the signal delay times that the bus wirings respectively have, and the smallest signal delay time (minimum value) thereof is halved with respect to the signal delay $\tau$ of the signal wiring LL (noticed bus wiring LL3, first signal wiring). Described with reference to FIG. 5A, the bus wiring (second signal wiring or third signal wiring) LL5 has the signal delay time being the maximum value, and the bus wiring LL1 (third signal wiring or second signal wiring) has the signal delay time being the maximum value. The time difference between a timing at which the voltage of the signal waveform SL1 is changed, and a timing at which the signal waveform SL5 is changed becomes equivalent to the above-described difference $\Delta t$. Representing the relationship between the difference $\Delta t$ between the maximum and minimum values of the signal delay time and the signal delay time T in a numerical formula yields the following equation (2):

$$2\tau > \Delta t \qquad (2)$$

That is, the signal delay time difference $\Delta \tau$ is set so as not to exceed twice ($2\tau$) the signal delay time $\tau$ of the bus wiring LL3 to be noticed. Preferably, the signal delay time difference $\Delta t$ is half ($\tau/2$) the signal delay time $\tau$ as in the following equation (3). A desirable state shown in the following equation (3) will principally be described in the embodiment 1.

$$2\tau/4 > \Delta t; \; \tau/2 > \Delta t \qquad (3)$$

When the bus wirings LL1 through LL6 respectively have the same sectional area, their signal delay times can be determined by physical wiring lengths. The relationship between the wiring length of each bus wiring and its signal delay time is represented by the following equation (4):

$$L = t_{pd}(c_0/\sqrt{\varepsilon_r \mu_r}) \qquad (4)$$

Where L indicates a wiring length, $t_{pd}$ indicates a signal delay time, $c_0$ indicates the velocity of light in vacuum, $\varepsilon_r$ indicates a specific dielectric constant of an insulating film around the wiring, and $\mu_r$ indicates specific permeability of the insulating film around the wiring. When the equation (1) indicative of the signal delay time $\tau$ is substituted into the equation (4) as the signal delay time $t_{pd}$, the wiring length $L_n$ of the signal wiring LL (bus wiring LL3) is determined by the following equation (5):

$$L_n = \frac{Ul}{2n}(c_0/\sqrt{\varepsilon_r \mu_r}); \; n = 2, 3, 4, \ldots \qquad (5)$$

Preferably, since the signal delay time difference $\Delta \tau$ is half the signal delay time $\tau$, a wiring length difference $L_{n,max} - L_{n,min}$ between a wiring length $L_{n,max}$ of a bus wiring of a plurality of bus wirings disposed adjacent to each other, at which a signal delay time being the maximum value is reached, and a wiring length $L_{n,min}$ of a bus wiring thereof at which a signal delay time being the minimum value is reached, is made so as not to exceed half ($L_n/2$) of the noticed bus wiring having the signal delay time $\tau$ as in the following equation (6) to thereby set the wiring lengths of the respective bus wirings.

$$L_{n,max} - L_{n,min} < L_n/2 \qquad (6)$$

That is, the bus wirings disposed adjacent to each other are set to have the wiring lengths between the minimum wiring-length bus wiring having the wiring length $L_{n,min}$ and the maximum wiring-length bus wiring having the wiring length $L_{n,max}$.

When the wiring length is described by taking FIG. 5 for example, the bus wiring of the maximum wiring length becomes LL5, and the bus wiring of the minimum wiring length becomes LL1. Each of the remaining bus wirings LL2, LL4 and LL6 is set to have a wiring length between the bus wiring LL1 and the bus wiring LL5. Further, the wiring length $L_n$ of the bus wiring LL3 is determined by the equation (5). Incidentally, the bus wiring LL3 also has the wiring length between the bus wirings LL1 and LL5.

Figure 6:
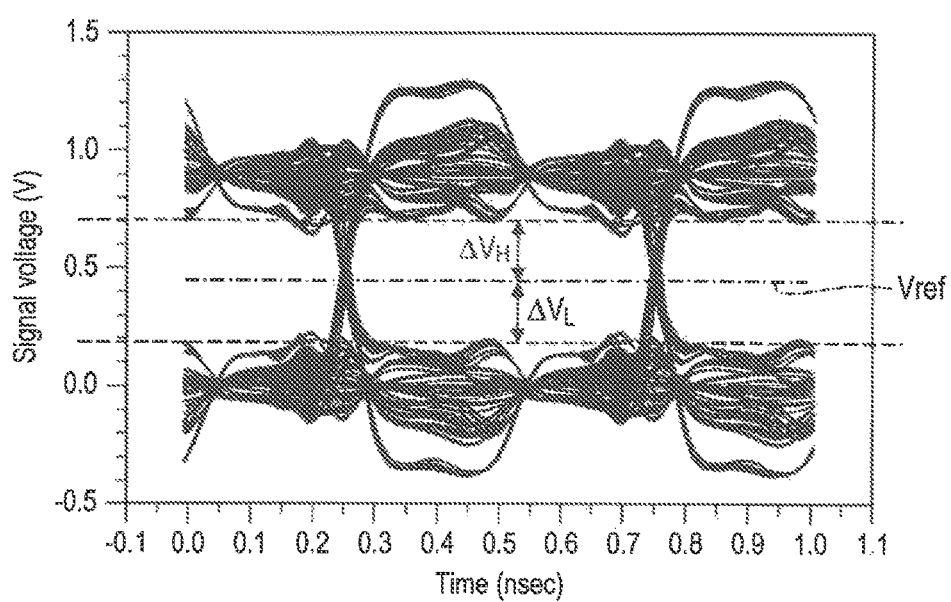
FIG. 6 is a diagram showing eye patterns according to the embodiment 1.

FIG. 6 is a diagram showing an eye pattern according to the embodiment 1. FIG. 6 is an eye pattern created by determining signal changes at the second end LN2 of the bus wiring LL3 where the wiring lengths of the bus wirings are set in the above-described manner such that the signal delay time difference Δt between the maximum wiring-length bus wiring and the minimum wiring-length bus wiring does not exceed the half of the signal delay time τ of the noticed bus wiring LL3. Even in the same figure, the horizontal axis indicates the time, and the vertical axis indicates the voltage. By the multi-reflection as described in FIG. 2, the voltage of the signal waveform at the second end LN2 is changed so as to exceed the voltage Vd or be lower than the voltage Vs when the signal waveform is changed. Described briefly, when the signal waveform propagated through the bus wiring LL3 is changed, a horn exceeding the voltage Vd or a horn lower than the voltage Vs is generated. In the region (P1, P3) of the horn, crosstalk noise from other bus wirings is given to the bus wiring LL3. Therefore, the eye pattern of FIG. 6 does not have such a region EY1 as shown in FIG. 5C, but assumes a rectangle similar to the signal waveform SL3 shown in FIG. 5A.

Since the wirings disposed in the organic interposer are used as the bus wirings LL1 through LL6, a loss in each bus wiring is small as compared with each wiring of a silicon interposer, but the voltage amplitude of the signal waveform at the second end LN2 of the bus wiring becomes small. Since, however, the eye pattern is made rectangular, as shown in FIG. 6, the eye pattern is made open stably in a range of a potential difference $\Delta V_H$ as viewed in a high voltage direction with a reference voltage Vref as a boundary. Further, the eye pattern is made open stably in a range of a potential difference $\Delta H_L$ as viewed in a low voltage direction. Therefore, the input circuit IBF can compare the reference voltage Vref and the voltage of the second end LN2 in an arbitrary timing and determine a logical value of a transmitted signal waveform. That is, it is possible to ensure a timing margin.

<Structure of Semiconductor Device>

Figure 7:
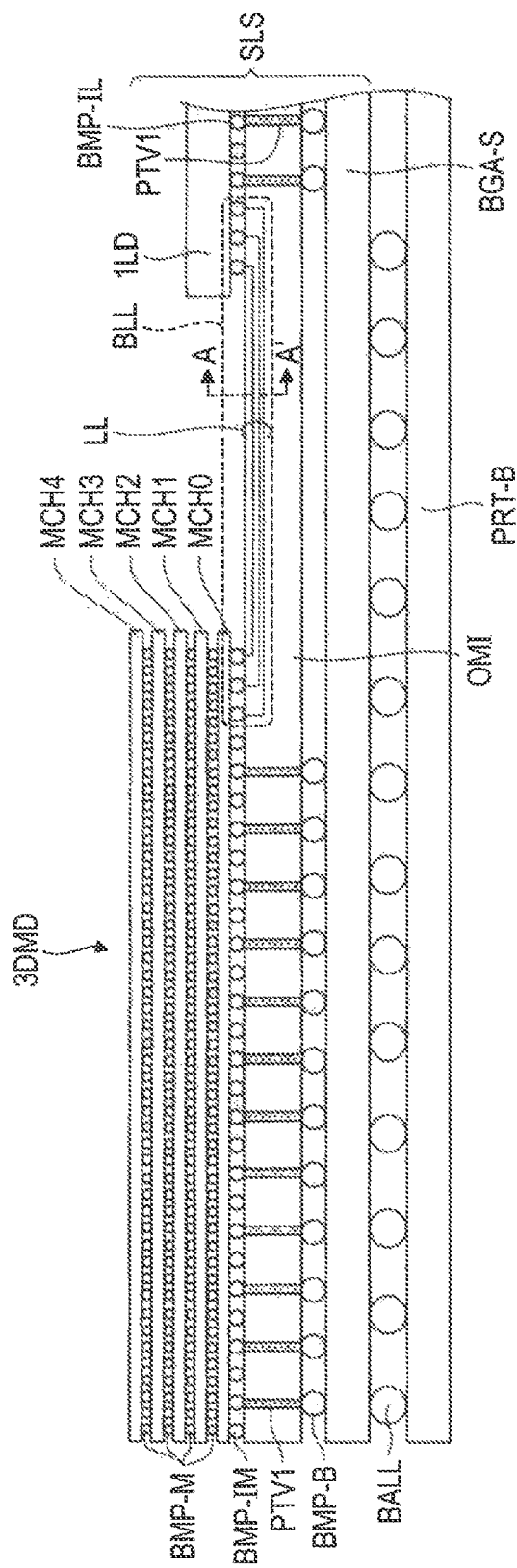
FIG. 7 is a sectional diagram showing the structure of a semiconductor device according to the embodiment 1.

The structure of the semiconductor device according to the embodiment 1 will next be described. A semiconductor device equipped with a 3-D memory chip and a logical chip mounted in an organic interposer will be described here as an example. FIG. 7 is a sectional diagram showing the structure of the semiconductor device according to the embodiment 1. A semiconductor device SLS in a state of being mounted onto a printed board PRT-B is drawn in FIG. 7. Such a semiconductor device is used in a module equipped with a high speed memory such as a so-called network memory or LPDDR5 or the like.

Although not restricted in particular, the semiconductor device SLS is sealed in a BGA (Ball Grid Array) package. That is, the semiconductor device SLS is equipped with a plurality of organic interposers mounted over a main surface of a BGA substrate BGA-S, and a plurality of semiconductor chips (dies) mounted over main surfaces of the organic interposers. In order to avoid the complication of drawings, there are shown in FIG. 7 only one organic interposer OMI mounted over the BGA substrate BGA-S, and a 3-D memory chip 3DMD and a logical chip 1LD mounted over a main surface of the organic interposer OMI.

The 3-D memory chip 3DMD is equipped with five memory chips MCH0 through MCH4 laminated three-dimensionally, and bumps BMP-M which electrically couple between the memory chips MCH0 through MCH4. In the same drawing, only the bumps disposed on the leftmost side are designated at sign BMP-M. The 3-D memory chip 3DMD is mounted in a predetermined first region of the main surface of the organic interposer OMI. The 3-D memory chip 3DMD and each wiring arranged at the main surface of the organic interposer OMI are electrically coupled therebetween by interposer bumps BMP-IM. In the same drawing, there are shown only the interposer bumps BMP-IM which couple between the memory chip MCH0 as the bottommost layer and each wiring arranged at the main surface of the organic interposer OMI. Further, sign BMP-IM is attached only to the interposer bump disposed on the leftmost side.

The logical chip 1LD is mounted in a predetermined second region of the main surface of the organic interposer OMI. The logical chip 1LD and each wiring arranged at the main surface of the organic interposer OMI are electrically coupled therebetween by interposer bumps BMP-IL. Only one shown on the rightmost side, of the interposer bumps coupling the logical chip 1LD and the organic interposer OMI is designated at sign BMP-IL.

The organic interposer OMI is equipped with a plurality of wiring layers though being described later using FIG. 8. Wirings formed by the wiring layers couple between the interposer bumps coupled the 3-D memory chip 3DMD and the interposer bumps coupled to the logical chip 1LD. In the same drawing, a bus wiring part BLL which couples between the 3-D memory chip 3DMD and the logical chip 1LD is surrounded by a broken line. The bus wiring part BLL includes a plurality of bus wirings LL which are adjacent to each other and extend in parallel. Further, the organic interposer OMI is equipped with PTV (Plated Through Via: dot embedded region) being a plurality of through vias. Each wiring arranged at the main surface of the organic interposer OMI and each wiring arranged at its back surface are electrically coupled therebetween through PTV1 being the through vias. Incidentally, even about the through vias PTV1, only one shown on the leftmost side is designated at sign PTV1.

A bump BMP-B is disposed between each of the wirings arranged at the main surface of the BGA substrate BGA-S and each of the wiring arranged at the back surface of the organic interposer OMI. The back-surface wiring of the organic interposer OMI and the main-surface wiring of the BGA substrate BGA-S are electrically coupled therebetween. The wiring arranged at the back surface of the BGA substrate BGA-S and the wiring arranged at the main surface of the printed board PRT-B are electrically coupled therebetween by a ball electrode BALL. Although not shown in the drawing, the BGA substrate BGA-S is equipped with interlayer wirings each coupling the main-surface wiring arranged at the main surface and the back-surface wiring arranged at the back surface. A desired main-surface wiring and a desired back-surface wiring are coupled therebetween by the corresponding interlayer wiring. Incidentally, even about the bumps coupling between the organic interposer OMI and the BGA substrate BGA-S, and the bump electrodes coupling between the BGA substrate and the printed board PRT-B, only those shown on the leftmost side in the same drawing are designated at signs BMP-B and BALL.

Figure 8:
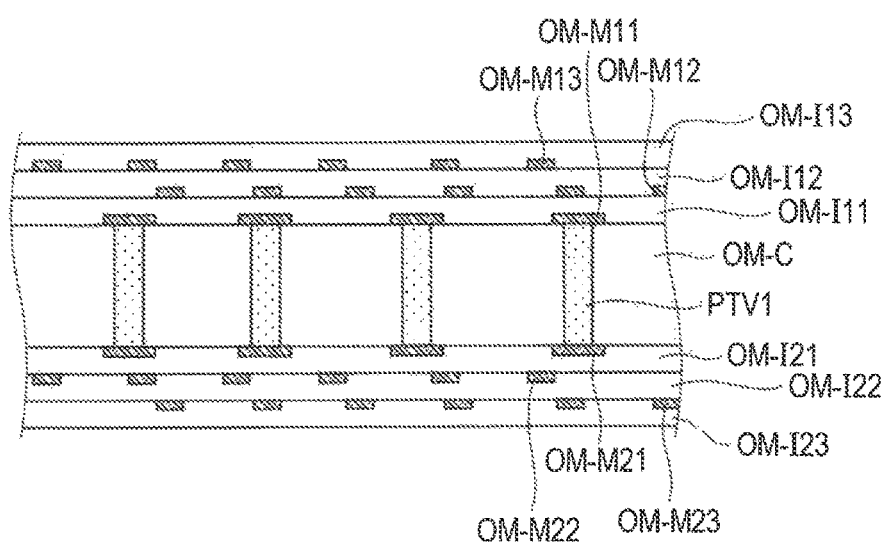
FIG. 8 is a sectional diagram showing the structure of an organic interposer according to the embodiment 1.

FIG. 8 is a sectional diagram showing the structure of the organic interposer OMI according to the embodiment 1. The organic interposer OMI is equipped with a core substrate OM-C formed of glass or an RF4-based material, and a plurality of wiring layers and a plurality of resin layers respectively laminated over main and back surfaces of the core substrate OM-C. Although a description will be made by taking for example, the case where the laminated wiring and resin layers are respectively three, they are not limited to the three layers. Incidentally, the thickness of the core substrate OM-C is 200 um, for example.

A first-layer wiring layer is formed over the main and back surfaces of the core substrate OM-C and processed into a desired shape, so that first-layer wirings OM-M11 and OM-M21 each having a desired shape are formed. Thereafter, resin layers OM-I11 and OM-I21 are laminated thereover. A wiring layer is formed on the upper side of each of the resin layers OM-I11 and OM-I21 and processed into a desired shape. Thus, second-layer wirings OM-M12 and OM-M22 each having a desired shape are formed. Thereafter, resin layers OM-I12 and OM-I22 are laminated thereover. A wiring layer is formed on the upper side of the resin layers OM-I12 and OM-I22 and processed into a desired shape, whereby third-layer wirings OM-M13 and OM-M23 each having a desired shape are formed. Further, resin layers OM-I13 and OM-I23 are laminated on the upper side of the third-layer wirings. Although being omitted in the same drawing, a wiring layer is formed on the upper side of each of the resin layers OM-I13 and OM-I23 and processed into a desired shape, and the interposer bumps BMP-IM (BMP-IL) and bumps BMP-B are coupled thereto.

Thus, the respective wirings are surrounded by the resin layers. At a spot to electrically couple between the wirings, an opening is provided in the resin layer interposed between the wirings. A conductive layer is embedded in the opening such that the wirings are electrically coupled therebetween via the opening. Further, the core substrate OM-C is provided with a plurality of through vias PTV1, which electrically couple the wirings disposed on the main surface side of the core substrate OM-C and the wirings disposed on the back surface side thereof.

Incidentally, in FIG. 8, in order to avoid the complication of the drawing, signs OM-M11 through M13, OM-M21 through M23 and PTV1 are respectively attached only to the wirings and through via disposed on the rightmost side.

<Structure of Bus Wiring Part>

Figure 9A:
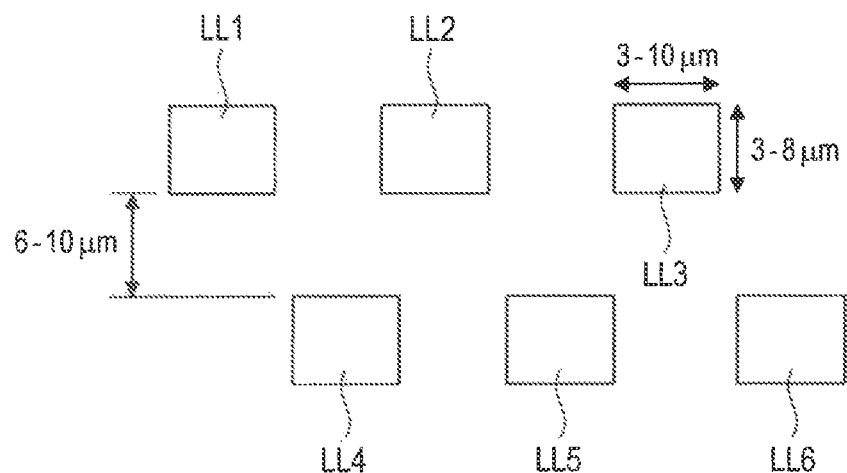
FIGS. 9A and 9B are respectively sectional diagrams showing the structure of a bus wiring part.
Figure 9B:
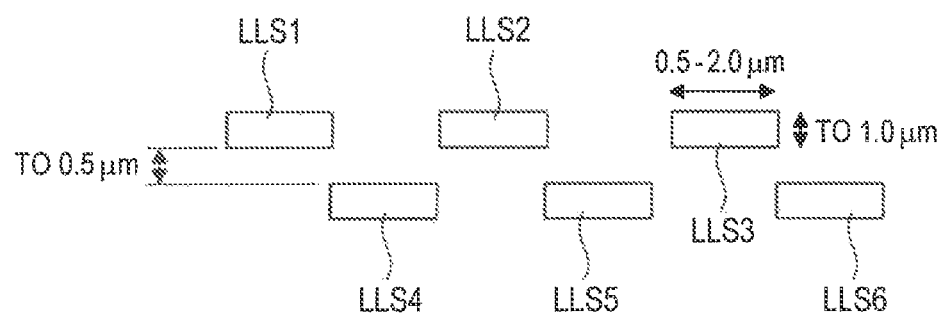

FIG. 9 is a sectional diagram showing the structure of the bus wiring part. FIG. 9A shows a cross-section where an organic interposer is used as an interposer, and FIG. 9B shows a cross-section where a silicon interposer is used. The cross-section of FIG. 9A is equivalent to the cross section taken along line A-A' shown in FIG. 7. A sectional structure of a more specific bus wiring part BLL will be described later using FIG. 10. A description will first be made here principally of a difference between a bus wiring disposed in the organic interposer and a bus wiring disposed in the silicon interposer by using FIG. 9.

In FIG. 9A, LL1 through LL6 indicate bus wirings respectively. The bus wirings LL1 through LL6 are adjacent to each other and extend in parallel. That is, in FIG. 9A, the bus wirings LL1 through LL6 respectively extend from the front side (or back side) of paper to its back side (front side) thereof and are parallel to each other. The wirings corresponding to two layers are used as the bus wirings LL1 through LL6 from the wirings OM-M11 through M13 or/and OM-M21 through M23 described in FIG. 8. For example, each of the bus wirings LL1 through LL3 is comprised of the second-layer wiring OM-M12, and each of the bus wirings LL4 through LL6 is comprised of the first-layer wiring OM-M11. Since they are wirings formed in the organic interposer, a wiring interval is wide, and a wiring width and thickness also become large. In the example of FIG. 9A, the interval (wiring interval) between the bus wirings ranges from 6 to 10 um, the wiring width of each bus wiring ranges from 3 to 10 um, and the wiring thickness thereof ranges from 3 to 8 um.

On the other hand, as the bus wirings disposed in the silicon interposer, wirings laminated over a silicon wafer are used therefor. Since the bus wirings are formed by the semiconductor manufacturing technology, it is possible to raise a wiring density and reduce a wiring width and thickness of each bus wiring. In FIG. 9B, the bus wirings formed by the semiconductor manufacturing technology are shown as the LLS1 through LLS6. Even in this case, the bus wirings LLS1 through LLS6 respectively extend from the front side (or back side) of paper to the back side (front side) thereof and are parallel to each other. In FIG. 9B, as an example, the distance between the upper and lower bus wirings is 0.5 um, for example, the wiring width of each of the bus wirings is from 0.5 to 2.0 um, and the wiring thickness thereof is 1.0 um, for example. Thus, when the silicon interposer is used, the bus wirings can be made high in density, but become high in manufacturing cost.

Figure 10:
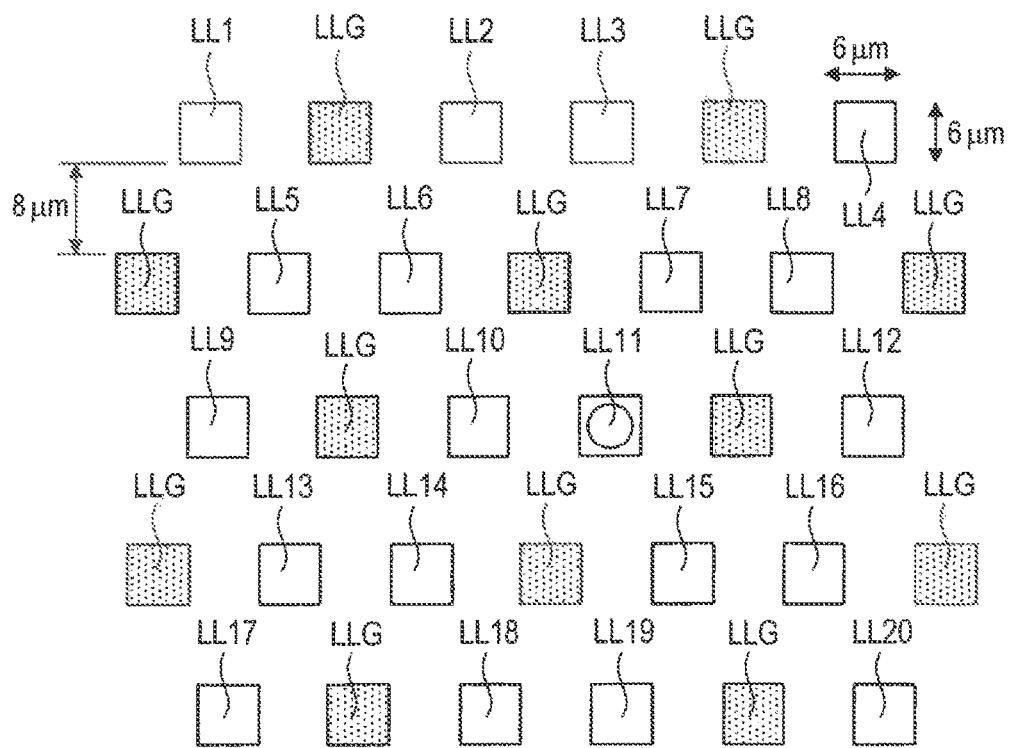
FIG. 10 is a sectional diagram showing the structure of a bus wiring part according to the embodiment 1.

FIG. 10 is a sectional diagram showing the structure of the bus wiring part BLL according to the embodiment 1. A cross-section of FIG. 10 is equivalent to the cross-section taken along line A-A' shown in FIG. 7. Although there has been described in FIGS. 7 and 8, the example in which in order to avoid the complication of the drawings, the three wiring layers are respectively formed over the main and back surfaces of the core substrate OM-C, and the wirings of the three layers are formed, FIG. 10 shows a case where five wirings layers are formed and wirings of five layers are formed. For example, wiring layers and resin layers corresponding to two layers are further formed on the upper side of the resin layer OM-I13 shown in FIG. 8, whereby wirings of five layers can be formed.

In FIG. 10, LL1 through LL20 indicate bus wirings. Further, LLG indicate shield wirings (voltage wirings) supplied with a predetermined voltage, e.g., a voltage Vs. The bus wirings LL1 through LL20 and the shield wirings LLG extend so as to be adjacent and parallel to each other. That is, the bus wirings LL1 through LL20 and the shield wirings LLG respectively extend from the front side (or back side) of paper to the back side (front side) thereof and are parallel to each other. The shield wirings LLG are discretely disposed within the bus wirings LL1 through LL20 at predetermined intervals. In the example of FIG. 10, the shield wirings LLG are disposed so as to interpose the two bus wirings therebetween as in the horizontal direction.

The bus wirings LL1 through LL20 and the shield wirings LLG have the same structure as each other. That is, the wiring width of each of the bus and shield wirings is set to be 6 um, and the wiring width thereof is also set to be 6 um. Further, the interval between the bus wirings is set to be 8 um. Since each shield wiring LLG has the same structure as the bus wiring, the shield wiring may be assumed to be the bus wiring. When it is assumed in this manner, a predetermined voltage (Vs) is supplied to the bus wirings disposed at predetermined intervals, out of the plural bus wirings, so that the bus wirings supplied with the predetermined voltage function as the shield wirings.

A description will be made about an example of correspondence between FIGS. 8 and 10. The bus wirings LL17 through LL20 and the shield wirings LLG disposed in this row are configured by the first-layer wiring OM-M11. The bus wirings LL13 through LL16 and the shield wirings LLG disposed in this row are configured by the second-layer wiring OM-M12. The bus wirings LL9 through LL12 and the shield wirings LLG disposed in this row are configured by the third-layer wiring OM-M13. In this case, the bus wirings LL5 through LL8 and the shield wirings LLG disposed in this row are configured by the fourth-layer wiring formed by the additional wiring layer. The bus wirings LL1 through LL4 and the shield wirings LLG disposed in this row are configured by the fifth-layer wiring formed by the additional wiring layer.

Since the shield wirings LLG are supplied with the predetermined voltage, crosstalk can be reduced by the shield wirings. Since, however, they are disposed in the organic interposer OMI, a bus wiring density becomes low and hence the distance between the shield wiring LLG and the bus wiring is separated. Hence, the effect of reducing crosstalk by the shield wiring LLG becomes low. Therefore, it is considered that when attention is paid to a bus wiring whose periphery is surrounded by other bus wirings, for example, the bus wiring LL11 (bus wiring added with a circle), signals at the bus wirings (e.g., LL7, LL10, LL15, etc.) disposed adjacent to the bus wiring LL11 to be noticed are changed to the reverse phase substantially simultaneously, so that antiphase crosstalk noise is generated, thereby affecting a signal at the bus wiring LL11 to be noticed. In the embodiment 1, the influence of the antiphase crosstalk ca be reduced by using the multi-reflection as described above.

Figure 11:
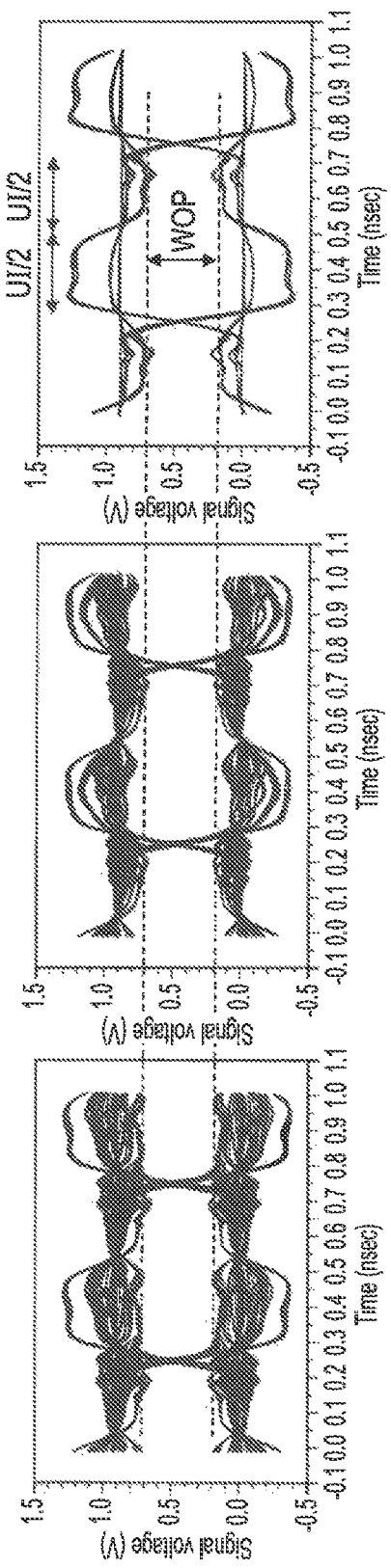
FIGS. 11A through 11C are respectively diagrams showing eye patterns according to the embodiment 1.

FIG. 11 is a diagram showing eye patterns according to the embodiment 1. FIG. 11 are eye patterns determined by realizing by simulation, states in which the bus wirings LL1 through LL20 and the shield wirings LLG are disposed as shown in FIG. 10. There are shown in FIG. 11, eye patterns at the second end LN2 of the bus wiring LL11 to be noticed, the second end LN2 of each bus wiring disposed adjacent to the bus wiring LL11, and the second end LN2 of each bus wiring away from the bus wiring LL11. Here, as described in FIGS. 2 and 3, etc., the impedances of the output and input circuits coupled to the noticed bus wiring LL11 are set in such a manner that multi-reflection is generated between the first end LN1 and second end LN2 of the noticed bus wiring LL11. Further, the wiring length of the bus wiring LL11 and the wiring length of each bus wiring adjacent to the bus wiring LL11 are also set as described in FIGS. 2 and 5, etc.

FIG. 11A shows an eye pattern at the second end LN2 of the noticed bus wiring LL11. FIG. 11B shows eye patterns at the second ends LN2 of the bus wirings LL10, LL7, and LL15 disposed adjacent to the bus wiring LL11. Further, FIG. 11C shows eye patterns at the second ends LN2 of the bus wirings LL1, LL4, LL17 and LL20, etc. disposed sufficiently away from the bus wiring LL11. The first ends LN1 of the bus wirings LL11 and bus wirings LL10, LL7, and LL15 are supplied with substantially simultaneously-changed signal waveforms from their corresponding output circuits. At this time, the signal waveform supplied to each of the bus wirings LL10, LL7, and LL15 is opposite in phase to the signal waveform supplied to the bus wiring LL11. Further, each of the bus wirings LL1, LL4, LL17, and LL20, etc. disposed sufficiently away from each other is supplied with a random signal waveform from its corresponding output circuit.

The antiphase crosstalk noise is supplied from the bus wirings LL10, LL7, and LL15 to the bus wiring LL11, but due to the multi-reflection as described in FIGS. 2 and 5, etc., the horn is generated in the region (period P1, P3) in which the signal waveform changes at the second end LN2 of the bus wiring LL11. Therefore, even when a change in the voltage of the signal waveform is suppressed by the antiphase crosstalk noise at the second end LN2 of the bus wiring LL11, the eye pattern at the second end LN2 of the bus wiring LL11 is substantially rectangular as shown in FIG. 11A and can thus be made to be an ideal opening. It is therefore possible to arbitrarily set the timing provided to determine the signal waveform even though an inexpensive organic interposer is used. That is, even though the antiphase crosstalk is generated by the simultaneous switching output, a timing margin can be ensured. Further, although the timing margin can be ensured even by extending the distance between the bus wirings and reducing the bus wiring density, the timing margin can be ensured even without reducing the bus wiring density according to the embodiment 1.

Even at the bus wirings disposed adjacent to each other, and the bus wirings disposed sufficiently away from each other, the opening of the eye pattern at the second end LN2 is rectangular as shown in FIGS. 11B and 11C. When FIG. 11A and FIGS. 11B and 11C are compared, all openings are rectangular, but a width (height) WOP with which the eye pattern is made open is reduced at the eye pattern according to the noticed bus wiring LL11 as compared with the eye patterns according to other bus wirings.

<Configuration of Bus Wiring Part>

Figure 12:
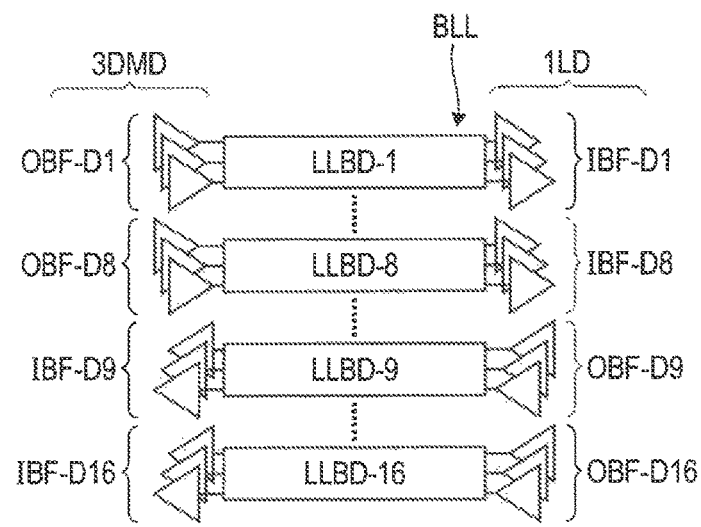
FIG. 12 is a block diagram showing the configuration of a bus wiring part according to the embodiment 1.

FIG. 12 is a block diagram showing the configuration of the bus wiring part BLL according to the embodiment 1. The 3-D memory chip 3DMD and the logical chip 1LD both shown in FIG. 7 are coupled therebetween by bus wirings each having a bus width of 1 Kbit, for example. That is, 1024 bus wirings LL are disposed in the bus wiring part BLL so as to be adjacent to each other and extend in parallel.

In the embodiment 1, the 1024 bus wirings are divided into a plurality of bus wiring bundles. Each of the bus wiring bundles includes a bus wiring (clock signal wiring) which propagates one synchronous clock signal. In other expressions, the bus wiring bundle can be assumed to be configured by a clock bus wiring which propagates a synchronous clock signal, and a plurality of signal bus wirings which propagate signals. Further, when the shield wirings are also assumed to be bus wirings, one bus wiring bundle can also be assumed to be configured by a clock bus wiring, a plurality of signal bus wirings, and a plurality of shielding bus wirings. In this case, the bus wirings (including the clock bus wiring, the signal bus wirings, and the shielding bus wirings) which configure one bus wiring bundle are disposed in the organic interposer OMI so as to be adjacent to each other and extend in parallel.

In FIG. 12, LLBD-1 through LLBD-16 indicate bus wiring bundles disposed in the bus wiring part BLL shown in FIG. 7. Each of the bus wiring bundles LLBD-1 through LLBD-16 is equipped with 64 bus wirings so as to have a bus width of 64 bits. Further, each of the bus wiring bundles is equipped with one clock bus wiring. Thus, the bus wiring bundles are respectively equipped with the 65 bus wirings. Incidentally, when the shield wirings are assumed to be bus wirings, the bus wiring bundles are respectively equipped with bus wirings exceeding 65. Further, the synchronous clock signal may be set as a pair of differential clock signals. In this case, since the number of clock bus wirings becomes two, the bus wiring bundles are respectively equipped with bus wirings exceeding 66.

The 3-D memory chip 3DMD is equipped with output circuit groups OBF-D1 through OBF-D8 corresponding to the bus wiring bundle LLBD-1 through LLBD-8, and input circuit groups IBF-D9 through IBF-D16 corresponding to the bus wiring bundles LLBD-9 through LLBD-16. Further, the logical chip 1LD is equipped with input circuit groups IBF-D1 through IBF-D8 corresponding to the bus wiring bundles LLBD-1 through LLBD-8, and output circuit groups OBF-D9 through OBF-D16 corresponding to the bus wiring bundles LLBD-9 through LLBD-16. The output circuit groups OBF-D1 through OBF-D16 are respectively equipped with a plurality of output circuits OBF (refer to FIG. 1). The output terminal ON1 of each output circuit OBF is coupled to the first end LN1 of the corresponding bus wiring disposed in the corresponding bus wiring bundle. Further, the input circuit groups IBF-D1 through IBF-D16 are also respectively equipped with a plurality of input circuits IBF (refer to FIG. 1). The input terminal IN1 of each input circuit IBF is coupled to the second end LN2 of the corresponding bus wiring disposed in the corresponding bus wiring bundle.

When signals are transmitted from the 3-D memory chip 3DMD to the logical chip 1LD, the signals are supplied from the output circuits of the output circuit groups OBF-D1 through OBF-D8 to the first ends LN1 of the corresponding bus wirings. The input circuits of the input circuit groups IBF-D1 through IBF-D8 provided in the logical chip 1LD receive the signals from the second ends LN2 of the corresponding bus wirings, so that processing is performed in the logical chip 1LD. On the other hand, when transmitting signals from the logical chip 1LD to the 3-D memory chip 3DMD, the signals are supplied from the output circuits of the output circuit groups OBF-D9 through OBF-D16 to the first ends LN1 of the corresponding bus wirings. The input circuits of the input circuit groups IBF-D9 through IBF-D16 provided in the 3-D memory chip 3DMD receive the signals from the second ends LN2 of the corresponding bus wirings, so that processing is performed in the 3-D memory chip.

Figure 13:
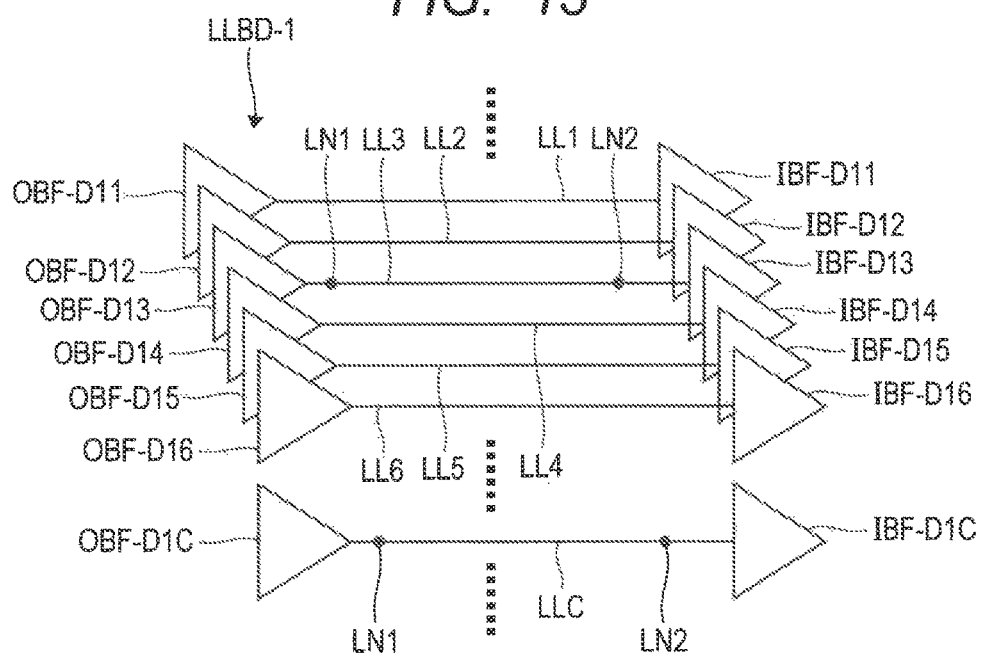
FIG. 13 is a block diagram showing the configuration of a bus wiring bundle according to the embodiment 1.

FIG. 13 is a block diagram showing the configuration of the bus wiring bundle according to the embodiment 1. FIG. 13 shows the configuration of the bus wiring bundle LLBD-1 shown in FIG. 12. The bus wiring bundles LLBD-1 through LLBD-16 shown in FIG. 12 has the same configuration as each other. Therefore, the configuration of the bus wiring bundle LLBD-1 will be described here as a representative. Since FIG. 13 is similar to FIG. 4, points of difference therebetween will mainly be described. In FIG. 13, signs attached to the output circuits are designated by OBF-D11 through D16 to clarify that the output circuit group OBF-D1 is comprised of a plurality of output circuits. Likewise, in order to clarify that the input circuit group IBF-D1 is comprised of a plurality of input circuits, signs attached to the input circuits are designated by IBF-D11 through D16.

Further, there is shown in FIG. 13, one clock bus wiring LLC which is adjacent to the bus wirings LL1 through LL6 and extends in parallel. There are also provided an output circuit (clock output circuit) OBF-D1C having an output terminal coupled to a first end LN1 of the clock bus wiring LLC and supplying a clock signal to the clock bus wiring LLC, and an input circuit (clock input circuit) IBF-D1C having an input terminal coupled to a second end LN2 of the clock bus wiring LLC and receiving the clock signal which reaches the second end LN2. Although not restricted in particular, the clock output circuit OBF-D1C is included in the output circuit group OBF-D1, and the clock input circuit IBF-D1C is included in the input circuit group IBF-D1.

The output circuits OBF-D11 through D16 are operated in sync with the clock signal output from the clock output circuit OBF-D1C. The input circuits IBF-D11 through D16 are also respectively operated in sync with the timing at which the clock input circuit IBF-D1C receives the clock signal therein. For example, each of the output circuits OBF-D11 through D16 supplies a signal waveform to the first end LN1 of its corresponding bus wiring in sync with the timing at which the output circuit OBF-D1C changes the voltage of the first end LN1 of the clock bus wiring LLC. Further, each of the input circuits IBF-D11 through D16 determines a propagated logical value on the basis of the voltage of the signal waveform at the second end LN2 of its corresponding bus wiring in sync with the timing at which the input circuit IBF-D1C determines a change in logical value from a change in the voltage at the second end LN2 of the clock bus wiring LLC.

Thus, in the single bus wiring bundle LLBD-1, the transmission of signal waveforms is performed substantially simultaneously by the bus wirings LL1 through LL6. Further, even in the case of reception thereof, the signal waveforms propagated through the bus wirings LL1 through LL6 can be determined substantially simultaneously.

In the embodiment 1, the 64 signal bus wirings are set in such a manner that a signal delay time difference (hereinafter also called skew time) $\Delta t$ between the signal bus wiring in the 64 signal bus wirings included in the single bus wiring bundle LLBD-1, which becomes smallest in signal delay time, and the signal bus wiring therein, which becomes largest in signal delay time, falls within the period (P1, P3 in FIG. 2) equivalent to twice the signal delay time $\tau$ of the signal bus wiring to be noticed for achieving a reduction in antiphase crosstalk noise. Since the difference in wiring length between the signal bus wiring brought to the signal delay time of the maximum value and the signal bus wiring brought to the signal delay time of the minimum value is equivalent to the skew time $\Delta t$ where the respective signal delay times of the 64 signal bus wirings are determined by their wiring lengths, the skew time $\Delta t$ and the signal delay time $\tau$ of the noticed signal bus wiring can be set by setting the wiring length of the noticed signal bus wiring and the difference in wiring length between the signal bus wiring taking the maximum value and the signal bus wiring taking the minimum value.

It is desirable that the skew time $\Delta t$ does not exceed ½ of the signal delay time $\tau$ of the noticed signal bus wiring. To this end, the difference in wiring length between the signal bus wiring taking the maximum value and the signal bus wiring taking the minimum value is preferably set so as not to exceed half of the wiring length of the noticed signal bus wiring as represented by the equation (6).

Of course, the wiring length of each of the signal bus wirings excluding the signal bus wiring taking the maximum value and the signal bus wiring taking the minimum value are set in such a manner that the signal delay time of each of the signal bus wirings excluding them exits between the maximum value and the minimum value.

Thus, even though the antiphase crosstalk noise is generated as described in FIG. 5, the opening of the eye pattern at the second end LN2 of the noticed signal bus wiring (e.g., LL3) affected by the antiphase crosstalk noise can be made rectangular. Therefore, even when each of the input circuits IBF-D11 through D16 determines the voltage of the signal waveform at the second end LN2 in early timing, an erroneous determination can be prevented.

Incidentally, the organic interposer OMI may be equipped with a single common clock signal wiring used in common aside from the clock bus wirings included in each bus wiring bundle. In this case, the clock signal supplied to the clock bus wiring included in each bus wiring bundle is set to be formed in sync with a clock signal propagated through the common clock signal wiring. Consequently, the clock signal can be synchronized between the bus wiring bundles.

Exemplification

The bus wirings which configure each of the bus wiring bundles LLBD-1 through LLBD-16 are arranged in a cross-section view such as shown in FIG. 10 in the organic interposer OMI (refer to FIG. 7). In this case, a resin material is interposed between the respective bus wirings as shown in FIG. 8. The resin material has, for example, a specific dielectric constant $\varepsilon_r$ of, for example, 3.2, and serves as an insulating film which electrically separates between the respective bus wirings. Each bus wiring transmits a signal changed in voltage centering the reference voltage Vref with the voltage supplied to the shield wiring LLG (refer to FIG. 10) as the reference voltage Vref (refer to FIG. 6) at a transmission rate of 2 Gbps. Of the bus wirings of the five layers shown in FIG. 10, one most subject to the antiphase crosstalk from the surrounding bus wirings is a three-layer bus wiring (e.g., LL11). Therefore, the three-layer bus wiring LL11 is assumed to be a noticed bus wiring to achieve a reduction in antiphase crosstalk noise.

Since the signal transmission rate is 2 Gbps, the cycle UI of data becomes 500 ps. Further, since the integer variable n is 2, the wiring length $L_n$ of the bus wiring LL11 is calculated from the equation (5) and becomes almost 21 mm. The skew time Δt is set according to the equation (2) or (3) in the units (64) of the bus wiring bundles including the noticed bus wiring LL11. In other words, when the bus wirings to be noticed included every bus wiring bundle are different in wiring length, the skew time Δt set for each bus wiring bundle varies.

A description will be made here of a case where a desirable skew time Δt is adopted. In this case, in the 64 signal bus wirings which configure each bus wiring bundle, the difference in wiring length between the signal bus wiring having the maximum wiring length ($L_{n,max}$) and the signal bus wiring having the minimum wiring length ($L_{n,max}$) is set so as to meet the equation (6). For example, the signal bus wiring having the maximum wiring length and the signal bus wiring having the minimum wiring length are set in such a manner that the difference in wiring length becomes 5 mm, for example. At this time, the wiring lengths of the remaining signal bus wirings are set between the maximum wiring length and the minimum wiring length.

The configuration of the output circuit (first output circuit) coupled to the first end LN1 of the noticed bus wiring LL11 is set to be the configuration shown in FIG. 3A, and the configuration of the input circuit (first input circuit) coupled to the second end LN2 thereof is set to be the configuration shown in FIG. 3B. Since no series termination resistor RZ1 is coupled in the output circuit shown in FIG. 3A, the combined impedance (differential resistance) of the output circuit part OBFP and the protective diodes D1 and D2 becomes 20Ω or so, for example. That is, the impedance of the output terminal ON1 becomes 20Ω or so. Further, although no parallel termination resistor RZ2 is coupled in the input circuit shown in FIG. 3B, the impedance of the input terminal IN1 becomes substantially 1MΩ or so because the leakage current of the protective diode or the like flows.

When no antiphase crosstalk is generated from the bus wiring adjacent to the noticed bus wiring LL11 where the simultaneous switching output is done in the bus wiring bundle, the impedance of the input terminal IN1 of the input circuit is high. Therefore, each time the signal waveform reaches the second end LN2, a reflected wave (so-called overshoot) SIRi1 (refer to FIG. 2) being in phase to the signal waveform is generated at the second end LN2 to which the input terminal IN1 is coupled. The generated in phase reflected wave is propagated from the second end LN2 to the first end LN1. The reflected wave reaches the first end LN1 after the signal delay time T. Since the impedance of the output terminal ON1 of the output circuit is low, a re-reflected wave (so-called undershoot) SIRi2 (refer to FIG. 2) antiphase to the reflected wave having reached the first end is generated at the first end LN1 to which the output terminal ON1 is coupled. The re-reflected wave is propagated from the first end LN1 to the second end LN2 and reaches the second end LN2 after the signal delay time T.

Since the integer variable n is set to 2 in the equation (1), the signal delay time τ is set to ¼ of the cycle UI of data. Therefore, the reflected wave SIRi1 generated at the second end LN2 reaches the second end LN2 as the re-reflected wave SIRi2 after UI/4×2=UI/2 (integer variable n). That is, the round time SSL (refer to FIG. 1) of the reflected wave SIRi1 becomes half the cycle UI of the data. As shown in FIG. 2, the signal waveform reaches with being delayed by half (twice of signal delay time τ=2τ) of the cycle UI of the data after having reached the second end LN2, and is combined with its corresponding signal waveform at the second end LN2. As a result, during the period (P1, P3) corresponding to the half of the cycle UI of the data from the change in signal waveform, the reflected wave SIRi1 and the re-reflected wave SIRi2 remain at the second end LN2 without their cancellation. Thus, the signal waveform SIi changed such that the time width has the horn of the half (UI/2) of the cycle UI is generated at the second end LN2.

Since the horn is generated at the second end LN2 when the signal waveform changes, a higher harmonic component is enhanced upon the change in the signal waveform, thereby making it possible to achieve shortening of the rising and falling times of the signal waveform. This action is similar to a kind of equalizing circuit in a high-speed signal circuit which improves steepening of the rise and fall of the signal waveform.

On the other hand, when the antiphase crosstalk is generated in the bus wiring adjacent to the noticed bus wiring LL11 where the simultaneous switching output is done in the bus wiring bundle, the influence by the antiphase crosstalk can be reduced by the existence of the horn. The antiphase crosstalk with the largest influence is generated when in all of the bus wirings adjacent to each other, their signal waveforms are simultaneously changed to the reverse phase with respect to the signal waveform at the noticed bus wiring. That is, it occurs where the logical values output to all of the bus wirings adjacent to each other are logical values opposite to the logical value of data output to the noticed bus wiring.

In this case, the signal waveforms at the bus wirings adjacent to each other rise or fall simultaneously during the period of the skew time Δt. Changes in their rise or fall are synthesized and transmitted to the noticed bus wiring as large antiphase crosstalk noise. With the simultaneous switching output, at this time, the signal waveform is falling or rising at the noticed bus wiring. The fall or rise of the signal waveform at the noticed bus wiring is suppressed by the large antiphase crosstalk noise and hence the signal waveform is deformed as shown in FIG. 5B. As a result, the eye pattern at the second end LN2 of the noticed bus wiring is crushed as shown in FIG. 5C. The eye pattern shown in FIG. 5C indicates where the antiphase crosstalk is relatively small. When the antiphase crosstalk is large, an eye pattern at a part where the signal waveform is being changed may completely be crushed. In such a case, there is also a case where erroneous determination is made at the input circuit. Alternatively, it is necessary to delay a determination timing at the input circuit.

On the other hand, according to the embodiment 1, the horn corresponding to the skew time Δt is generated during the period (rising or falling period) in which the signal waveform is changed at the noticed bus wiring. Since the voltage of the signal waveform is extra high or low in advance during the horn period, the suppression of the voltages supplied from the adjacent bus wirings can be cancelled by the antiphase crosstalk. Further, the wiring length of each bus wiring is determined in such a manner that the signal waveform of each bus wiring included in the bus wiring bundle is changed during the period of the generated horn. Therefore, the changes in signal at all the bus wirings excluding the noticed bus wiring are generated during the period of the horn. Even though these bus wirings are changed in voltage in the antiphase direction, it is possible to reduce the influence by the antiphase crosstalk.

<Modification>

FIG. 14 is a diagram for describing data transmission according to a modification of the embodiment 1. Since FIG. 14 is similar to FIG. 2, points of difference therebetween will principally be described. FIG. 2 has described where the integer variable n in the equation (1) is 2. That is, the description has been made about the case where the signal delay time (one-way signal delay time) τ of the signal wiring (bus wiring) LL shown in FIG. 1A is set to ¼ of the cycle UI of the data. On the other hand, 3 is set as the integer variable n in the present modification. Therefore, the signal delay time τ of the signal wiring LL is set to ⅙ of the cycle UI.

As shown on the lower side of FIG. 14B, the re-reflected wave SIRi2 which reaches the second end LN2 of the signal wiring LL reaches after the round signal delay time (2τ) of the signal wiring LL from the generation of the reflected wave SIRi1 at the second end LN2. As a result, the periods P1 and P3 during which the reflected wave SIRi1 and the re-reflected wave SIRi2 are being superposed become the round signal delay time (2τ). The period P2 during which the reflected wave SIRi1 and the re-reflected wave SIRi2 are cancelled out each other becomes twice (4τ) the round signal delay time. Thus, as shown in FIG. 14C, the ratio between the period during which the horn (horn of voltage) is generated at the second end LN2 (input terminal IN1 of input circuit) and the period during which the horn is not generated becomes 1:2 in the cycle UI. When the proportion of the period during which the horn is not generated is designated at sign ND, the value of sign ND is changed to 2 (3, 4, . . . ) by changing the integer variable n to 3, (4, 5, . . . ).

That is, the ratio between the period during which the horn is generated at the second end LN2 and the period during which the horn is not generated can be changed by changing the integer variable n. Therefore, it is possible to set a period for reducing the influence of the antiphase crosstalk noise generated during the skew time by changing the integer variable n according to the skew time Δt between the maximum and minimum values of the signal delay time at each bus wiring bundle.

<Integer Variable n>

A description will be made about the reason why the integer variable n is set to the integer in the equations (1) and (5).

First assume where the integer variable n is set to a rational number being not an integer. In the embodiment 1, the reflection wave and the re-reflected wave travel back and form several times between the first end LN1 of the signal wiring (bus wiring) and the second end LN2 thereof. While they repeatedly travel back and forth, there occurs a case where the round time necessary to go back and forth is not divided by the cycle UI of the data. Further, when the integer variable n is set to an irrational number being not the rational number, the reflected wave and the re-reflected wave are shifted each time they travel back and forth.

In order to measure a jitter being a deviation in timing of the signal waveform at the second end LN2, the same signal waveform is supplied to the first end LN1 repeatedly in the cycle UI of the data to determine the eye pattern at the second end LN2. In the case, the eye pattern is formed into a shape in which the re-reflected wave before several cycles overlaps with the present reflection signal. When the round time for the reflected wave and the re-reflected wave is not divided by the cycle UI, the reflected wave and the re-reflected wave at the second end LN2 are gradually shifted when they repeatedly go back and forth, so that the opening of the eye pattern determined by the jitter measurement becomes gradually small. Likewise, when the reflected wave and the re-reflected wave are shifted each time they travel back and forth, the opening of the eye pattern determined by the jitter measurement becomes gradually small.

That is, when the integer variable n is not an integer, the reflected wave and the re-reflected wave are not synthesized well at the second end LN2, so that the effect of reducing the antiphase crosstalk noise is gradually reduced, thus resulting in closing of the opening of the eye pattern. Therefore, an integer of 2 or more is set to the integer variable n.

<Wiring Length and Wiring Length Skew of Noticed Signal Wiring (Bus Wiring)>

In the embodiment 1, the signal wirings (bus wirings) are disposed in the organic interposer, but the wiring length $L_n$ of the noticed signal wiring is determined by the equation (5) according to the material used to form the organic interposer, the cycle UI of the data, and the integer variable n, etc. The skew length corresponding to the skew time Δt being the difference between the maximum and minimum values of the signal delay time is also determined by the equation (6). Next, there are shown an example of a wiring length of each signal wiring disposed in an organic interposer formed by a laminate resin (specific dielectric constant $\varepsilon_r$=3.2) of a paramagnetic material and an example of a wiring length of each signal wiring disposed in an organic interposer formed by an FR4-based substrate (specific dielectric constant $\varepsilon_r$=4.2) of a paramagnetic material used in a printed board/BGA substrate or the like.

FIGS. 15 and 16 are respectively diagrams showing the wiring length of the signal wiring according to the embodiment 1. FIG. 15 shows where the above-describe laminate resin is used in the organic interposer, and FIG. 16 shows where the above-described FR4-based substrate is used in the organic interposer.

FIG. 15A shows where a communication rate (Rate) of data propagated through the signal wiring (bus wiring) is 1 Gbps, FIG. 15B shows where the communication rate is 2 Gbps, and FIG. 15C shows where the communication rate is 4 Gbps. Since the communication rate Rate is 1 Gbps in FIG. 15A, the cycle UI of the data becomes 1000 ps, the cycle UI becomes 500 ps in FIG. 15B, and the cycle UI becomes 250 ps in FIG. 15C. Further, the specific dielectric constant $\varepsilon_r$ is 3.2. By setting the integer variable n from 2 to 10, the wiring length $L_n$ of the signal wiring to be noticed assumes different values as shown in FIGS. 15A through 15C. The wiring length skew is preferably set to be a value exceeding half (equation (6)) of the wiring length $L_n$ of the noticed signal wiring as expressed in the equation (6).

As with FIGS. 15A through 15C, FIGS. 16A through 16C also show the wiring length $L_n$ of a noticed signal wiring for each integer variable n when the communication rate (Rate) is 1 Gbps, 2 Gbps, and 4 Gbps. Even here, the value of a desirable wiring length skew is a value not exceeding half of the noticed signal wiring $L_n$.

Embodiment 2

The embodiment 1 is configured so as not to couple the series termination resistor RZ1 as shown in FIG. 3A in such a manner that the impedance of the output terminal ON1 of the output circuit becomes low, and couple the parallel termination resistor RZ2 as shown in FIG. 3B in such a manner that the impedance of the input terminal IN1 of the input circuit becomes high. Thus, the input circuit is configured so as to have such impedance as to generate, at the second end LN2 to which the input terminal IN1 is coupled, the reflected wave being in phase with the signal waveform having reached the second end LN2. Further, the output circuit is configured so as to have such impedance as to generate, at the first end LN1 to which the output terminal ON1 is coupled, the re-reflected wave being in antiphase with the reflected wave having reached the first end LN1. Thus, the reflected wave and the re-reflected wave are superposed on each other at the second end LN2 to set the opening of the eye pattern at the second end LN2 to be rectangular. As shown in FIG. 11, etc., however, the amplitude of the signal waveform at the second end LN2 becomes small.

In the embodiment 2, the output circuit and/or input circuit described in the embodiment 1 are changed. Only the output circuit and/or the input circuit are changed and other configurations are the same as those of the embodiment 1. A description will therefore be made here only about the output circuit and the input circuit.

<Output Circuit>

Figure 17:
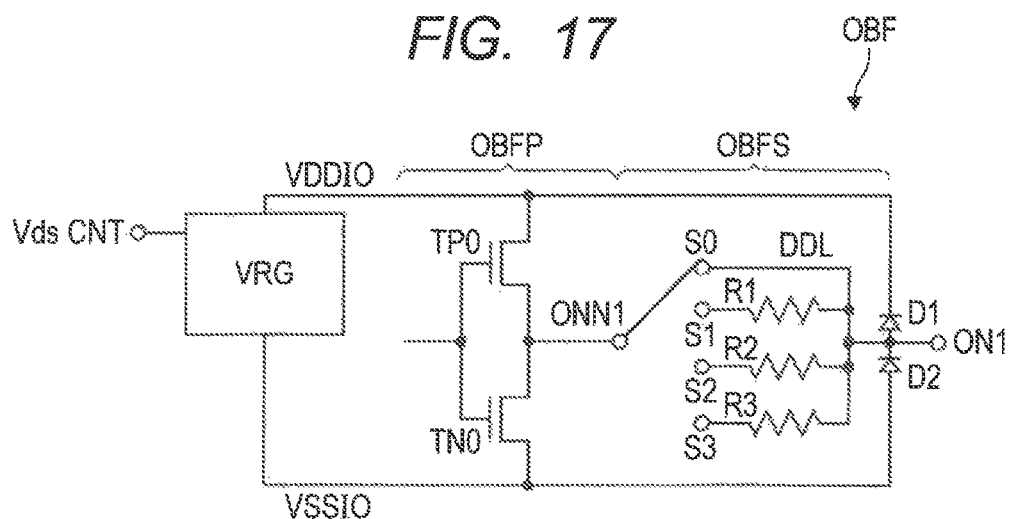
FIG. 17 is a circuit diagram showing the configuration of an output circuit according to an embodiment 2.

FIG. 17 is a circuit diagram showing the configuration of an output circuit according to the embodiment 2. Since FIG. 17 is similar to FIG. 3A, points of difference therebetween will principally be described.

The output circuit OBF is equipped with an output circuit part OBFP and a selection part OBFS. The output circuit part OBFP is equipped with a CMOS type inverter circuit as with FIG. 3A. However, a source of a P-type transistor TP0 which configures the CMOS type inverter circuit is supplied with a voltage VDDIO formed by a voltage regulator circuit VRG, and a source of an N-type transistor TN0 is supplied with a voltage VSSIO formed by the voltage regulator circuit VRG. Further, the selection part OBFS is equipped with a selector switch, resistors R1 through R3, and a signal wiring DDL coupled between an output terminal ONN1 of the output circuit part OBFP and an output terminal ON1 of the output circuit.

The selector switch is equipped with terminals S0 through S3 and a common terminal. In the example of FIG. 17, the above-described output terminal ONN1 is used in common as the common terminal of the selector switch. Any of the terminals S0 through S3 is selected, and the selected terminal is electrically coupled to the common terminal (output terminal ON1). The signal wiring DDL is coupled between the terminal S0 and the output terminal ON1, and the resistors R1 through R3 are coupled between the terminals S1 through S3 and the output terminal ON1. Here, the resistors R1 through R3 have resistance values different from each other. Further, the signal wiring DDL is a wiring formed so as not to positively have a resistance value. Therefore, the value of a parasitic resistance of the signal wiring DDL is set smaller than any of the resistors R1 through R3.

The voltage regulator circuit VRG forms a voltage Vd or a voltage higher than the voltage Vd in accordance with a voltage control signal VdsCNT and supplies it to the source of the P-type transistor TP0 as the voltage VDDIO. Further, the voltage regulator circuit VRG forms a voltage Vs or a voltage lower than the voltage Vs in accordance with the voltage control signal VdsCNT and supplies it to the source of the N-type transistor TN0 as the voltage VSSIO. Incidentally, although not restricted in particular, protective diodes D1 and D2 are coupled between the output terminal ON1 and the voltages VDDIO and VSSIO.

Since each of the 3-D memory chip 3DMD and the logical chip 1LD is equipped with the output circuit as described in FIGS. 12 and 13, it has the output circuit OBF and the voltage regulator circuit VRG both shown in FIG. 17. Each chip is provided with, for example, four fuses corresponding to each of the output circuits. Any of the terminals S0 through S3 is selected according to the presence or absence of cutting-out of each fuse. By, for example, cutting the remaining three fuses while leaving the fuse corresponding to the terminal S0, the terminal S0 is selected, and hence the common terminal (ON1) is coupled to the terminal S0 and the remaining terminals S1 through S3 are separated from the common terminal. Further, when the remaining three fuses are cut while leaving the fuse corresponding to the terminal S1, the terminal S1 is selected and coupled to the common terminal (ON1). Other terminals S2 and S3 are also similar to the above.

The fuse is left in such a manner that the terminal S0 is selected with respect to the output circuit coupled to a noticed signal wiring (noticed bus wiring) where antiphase crosstalk noise is desired to be reduced, and the remaining three fuses are cut out. Thus, as with FIG. 3A, the output terminal ONN1 of the output circuit part OBFP is coupled to the output terminal ON1 in a state in which no series termination resistor is coupled. As a result, the effect of reducing the antiphase crosstalk noise is maximized.

On the other hand, in the output circuit coupled to the signal wiring (bus wiring) which may reduce the effect of reducing the antiphase crosstalk noise, the fuse is cut in such a manner that any of S1 through S3 is selected. Thus, the resistor coupled to the selected terminal functions as a series termination resistor. For example, the resistance value is set to increase from the resistor R1 to the resistor R3, thereby achieving, for example, impedance matching by the resistor R3 highest in resistance value. Thus, when the resistor R3 is selected, a reduction in loss due to impedance mismatching can be achieved. When the resistor R1 or R2 is selected, the effect of reducing the antiphase crosstalk noise is reduced, but a loss due to impedance mismatching can also be reduced. Incidentally, the number of resistors is not limited to three, but may be one or more.

When the antiphase crosstalk noise is reduced, the voltage regulator circuit VRG forms, as the voltages VDDIO and VSSIO, a voltage higher than the voltage Vd and a voltage lower than the voltage Vs in accordance with the voltage control signal VdsCNT. Thus, a signal waveform which is changed between the voltage higher than the voltage Vd and the voltage lower than the voltage Vs is supplied to the output terminal ON1 of the output circuit OBF. As a result, it is possible to increase the amplitude of the signal waveform at the second end LN2 of the signal wiring. That is, the open width WOP of the eye pattern shown in FIG. 11 can be made large. Thus, when the voltage VDDIO (VSSIO) supplied to the output circuit OBF is made high (low), power consumption is increased. Since, however, no series termination resistor is coupled when the terminal S0 is selected, for example, the generation of power consumption at the series termination resistor can be suppressed, thereby making it possible to suppress an increase in power consumption.

Incidentally, the voltage regulator circuit VRG may be provided relative to each output circuit. A common voltage regulator circuit VRG may be provided. Upon providing the common voltage regulator circuit VRG, for example, the voltage Vd, the voltage higher than the voltage Vd, the voltage Vs, and the voltage lower than the voltage Vs are formed by the common voltage regulator circuit VRG, and each output circuit may select the corresponding voltage. Further, the selector switch may be controlled by a control circuit provided in a chip without by the fuses.

Further, either the selection part OBFS or the voltage regulator circuit VRG may be provided. When only the voltage regulator circuit VRG is provided, the output terminal ONN1 servers as the output terminal ON1.

<Input Circuit>

Figure 18:
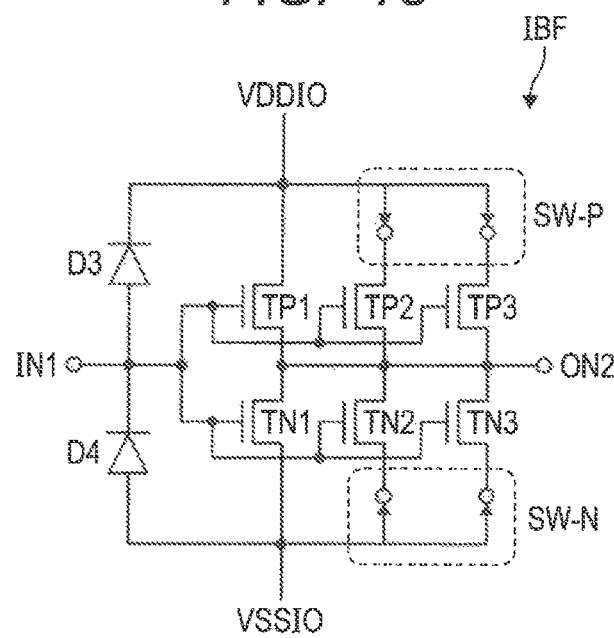
FIG. 18 is a circuit diagram showing the configuration of an input circuit according to the embodiment 2.

FIG. 18 is a circuit diagram showing the configuration of an input circuit according to the embodiment 2. Since FIG. 18 is similar to FIG. 3B, points of difference therebetween will principally be described. In FIG. 3B, the source of the P-type transistor TP1 which configures the CMOS type inverter circuit is coupled to the voltage Vd, and the source of the N-type transistor TN1 is coupled to the voltage Vs. On the other hand, in FIG. 18, a source of a P-type transistor TP1 is supplied with the voltage VDDIO formed by the voltage regulator circuit VRG (refer to FIG. 17), and a source of an N-type transistor TN1 is supplied with the voltage VSSIO formed by the voltage regulator circuit VRG.

Further, a P-side switch SW-P and P-type transistors TP2 and TP3 are coupled in series between an output terminal ON2 of the input circuit IBF and the voltage VDDIO. N-type transistors TN3 and TN4 and an N-side switch SW-N are coupled in series between the output terminal ON2 and the voltage VSSIO. The P-side switch SW-P and the N-side switch SW-N are controlled by fuses provided in a chip or a control circuit provided within the chip.

A voltage higher than the voltage Vd formed by the voltage regulator circuit VRG and a voltage lower than the voltage Vs formed thereby are supplied to the input circuit IBF coupled to the second end LN2 of the signal wiring (bus wiring) to be noticed for achieving a reduction in antiphase crosstalk noise as the voltages VDDIO and VSSIO. Thus, it is possible to increase a difference in potential between the voltage Vref (refer to FIG. 6) as a reference for the signal waveform and the source of each of the P-type transistor TP1 and the N-type transistor TN1. As a result, a threshold voltage can substantially be reduced. Even though the amplitude of the voltage at the second end LN2 is made small, i.e., the width WOP of the eye pattern is made narrow, it is possible to prevent an erroneous determination from being made.

Further, the P-side switch SW-P and N-side switch SW-N included in the input circuit IBF coupled to the second end LN2 of the signal wiring (bus wiring) to be noticed for achieving the reduction in the antiphase crosstalk noise are respectively brought to an on state by the fuses or control circuit. Since gates of the P-type transistors TP2 and TP3 are coupled to a gate of the P-type transistor TP1, and gates of the N-type transistors TN2 and TN3 are coupled to a gate of the N-type transistor TN1, the output terminal ON2 is driven by the P-type transistors TP1 through TP3 or N-type transistors TN1 through TN3 coupled in parallel. Thus, even though a change in the voltage at the second end LN2 is small, the voltage of the output terminal ON2 can be changed at a high speed.

Since the voltages VDDIO and VSSIO are supplied to the output circuit OBF and the input circuit IBF through the voltage regulator circuit VRG, it is possible to improve resistance to a fluctuation in voltage as compared with the case where they are supplied from the outside of the chip.

A P-type transistor and an N-type transistor, and a P-side switch and an N-side switch coupled in parallel to the P-type transistor TP1 and the N-type transistor TN1 may be provided without the supply of power from the voltage regulator circuit VRG. To the contrary, power may be supplied from the voltage regulator circuit VRG without providing the P-type and N-type transistors and the P-side and N-side switches coupled in parallel to the P-type transistor TP1 and the N-type transistor TN1.

Both of the output and input circuits described in the embodiment 2 may be applied to the semiconductor device described in the embodiment 1, or only either one of them may be applied thereto.

According to the embodiments 1 and 2, the influence by the crosstalk can be suppressed even without making wide the wiring interval between the signal wirings (bus wirings), i.e., lowering the wiring density. It is possible to provide the semiconductor device using the inexpensive organic interposer.

Although the invention made above by the present inventors has been described specifically on the basis of the preferred embodiments, the present invention is not limited to the embodiments referred to above. It is needless to say that various changes can be made thereto within the scope not departing from the gist thereof. Although the embodiment has been described by taking for example, the signal wirings disposed in the organic interposer, the signal wirings may be those disposed in a wiring substrate comprised of an organic material. There may be utilized, for example, a package substrate of an organic material, such as an MCM substrate or an Sip substrate, including a module substrate comprised of an organic material without using the interposer. Further, although the embodiment has been described by taking for example, the signal wirings adjacent to each other and extending in parallel to each other, the embodiment is not limited to this. That is, other signal wirings may be disposed so as to have the influence of the crosstalk on the signal wiring to be noticed (noticed bus wiring). For example, other wirings may be disposed so as to be three-dimensionally perpendicular to the noticed signal wiring.

What is claimed is:

1. A semiconductor device comprising:
    a first signal wiring which is disposed in an interposer or a wiring substrate with an organic material as a dielectric and equipped with a first end and a second end;
    a second signal wiring which is disposed in the interposer or the wiring substrate and transmits a signal;
    a first output circuit which has an output terminal coupled to the first end of the first signal wiring and which sets an impedance at the output terminal so as to generate a reflected wave in a direction opposite in phase to a waveform transmitted to the first end and periodically outputs data to the output terminal;

a first input circuit which has an input terminal coupled to the second end of the first signal wiring and sets an impedance at the input terminal so as to generate a reflected wave in the same phase direction as a waveform transmitted to the second end;

a second output circuit which is coupled to the second signal wiring and outputs a signal to the second signal wiring; and a second input circuit which is coupled to the second signal wiring and inputs the signal at the second signal wiring therein, wherein the first signal wiring is set in such a manner that an average delay between the first and second ends of the first signal wiring becomes 1/integer of 2 or more with respect to a half of a cycle of the data, and wherein a difference between the maximum and minimum values of a delay of the signal at the second signal wiring is set so as not to exceed twice the average delay.

2. The semiconductor device according to claim 1, wherein the second signal wiring is disposed in the interposer or the wiring substrate so as to be parallel to the first signal wiring.

3. The semiconductor device according to claim 2, comprising a voltage wiring which is disposed in the interposer or the wiring substrate so as to be parallel to the first signal wiring and the second signal wiring and supplied with a predetermined voltage.

4. The semiconductor device according to claim 3, wherein the first output circuit is equipped with an output circuit part coupled to the output terminal without through a termination resistor, and wherein the first input circuit is equipped with an input circuit part coupled to the input terminal free of connection of a termination resistor.

5. The semiconductor device according to claim 3, wherein the first output circuit is equipped with an output circuit part and a selection part coupled between the output circuit part and the output terminal, and wherein the selection part couples between an output terminal of the output circuit part and the output terminal of the first output circuit by either one of a termination resistor and a signal wiring.

6. The semiconductor device according to claim 4, comprising a voltage regulator circuit which forms a power supply voltage supplied to the output circuit part.

7. A semiconductor device comprising:

a plurality of wiring bundles disposed in an interposer or a wiring substrate with an organic material as a dielectric and each having a clock signal wiring transmitting a clock signal and a plurality of signal wirings each transmitting a signal in sync with the clock signal;

each of the wiring bundles including:

a first signal wiring equipped with a first end and a second end; and a second signal wiring and a third signal wiring disposed so as to be parallel to the first signal wiring;

an output circuit which has an output terminal coupled to the first end of the first signal wiring and which sets an impedance at the output terminal so as to generate a reflected wave in a direction opposite in phase to a waveform transmitted to the first end and periodically outputs data to the output terminal; and an input circuit which has an input terminal coupled to the second end of the first signal wiring and sets an impedance at the input terminal so as to generate a reflected wave in the same phase direction as a waveform transmitted to the second end, wherein the first signal wiring is set in such a manner that an average delay between the first and second ends of the first signal wiring becomes 1/integer of 2 or more with respect to a half of a cycle of the data, and wherein the second signal wiring and the third signal wiring are set in such a manner that a difference between a signal delay at the second signal wiring and a signal delay at the third signal wiring does not exceed twice the average delay.

8. The semiconductor device according to claim 7, wherein a signal delay at the signal wiring excluding the first signal wiring, the second signal wiring and the third signal wiring, of the signal wirings included in the one wiring bundle exists between the signal delay at the second signal wiring and the signal delay at the third signal wiring.

9. The semiconductor device according to claim 8, wherein in each of the wiring bundles, the signal wirings are disposed so as to be parallel to the clock signal wiring, and wherein each of the wiring bundles is equipped with a voltage wiring disposed parallel to the clock signal wiring and supplied with a predetermined voltage.

10. The semiconductor device according to claim 9, wherein the output circuit is equipped with an output circuit part coupled to the output terminal without through a termination resistor, and wherein the input circuit is equipped with an input circuit part coupled to the input terminal free of connection of a termination resistor.

11. The semiconductor device according to claim 9, wherein the output circuit is equipped with an output circuit part and a selection part coupled between the output circuit part and the output terminal, and wherein the selection part couples between an output terminal of the output circuit part and the output terminal of the output circuit by either one of a termination resistor and a signal wiring.

12. The semiconductor device according to claim 10, comprising a voltage regulator circuit which forms a power supply voltage supplied to the output circuit part.

13. The semiconductor device according to claim 8, wherein the second signal wiring and the third signal wiring are set in such a manner that a difference between a signal delay at the second signal wiring and a signal delay at the third signal wiring does not exceed half of the average delay.

* * * * *